(12) United States Patent
Hanzawa et al.

(10) Patent No.: US 8,634,257 B2
(45) Date of Patent: Jan. 21, 2014

(54) SEMICONDUCTOR STORAGE DEVICE WITH MEMORY CELL UTILIZED AS A SET-DEDICATED MEMORY CELL

(75) Inventors: Satoru Hanzawa, Hachioji (JP); Hiroyuki Minemura, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 72 days.

(21) Appl. No.: 13/466,866

(22) Filed: May 8, 2012

(65) Prior Publication Data

US 2012/0287697 A1 Nov. 15, 2012

(30) Foreign Application Priority Data

May 10, 2011 (JP) ................................. 2011-105113

(51) Int. Cl.
*G11C 7/22* (2006.01)

(52) U.S. Cl.
USPC ....... 365/189.14; 365/148; 365/163; 365/175

(58) Field of Classification Search
USPC ................... 365/148, 158, 163, 175, 189.14, 365/189.15, 189.16
See application file for complete search history.

(56) References Cited

U.S. PATENT DOCUMENTS

| | | | |
|---|---|---|---|
| 6,862,214 B2 * | 3/2005 | Lee et al. ....................... | 365/163 |
| 7,359,236 B2 * | 4/2008 | Gilbert ........................... | 365/163 |
| 2008/0149913 A1 | 6/2008 | Tanaka et al. | |
| 2010/0315866 A1 * | 12/2010 | Park et al. ..................... | 365/163 |
| 2012/0243306 A1 * | 9/2012 | Karpov et al. ................. | 365/163 |

FOREIGN PATENT DOCUMENTS

JP 2008-160004 A 7/2008

\* cited by examiner

*Primary Examiner* — Andrew Q Tran
(74) *Attorney, Agent, or Firm* — Miles & Stockbridge P.C.

(57) ABSTRACT

A semiconductor storage device crystallizes variable resistive element material layers arranged on side surfaces of multiple semiconductor layers in a stacked structure concurrently by applying a first current to any one of semiconductor layers in the stacked structure, and thereafter applies a second current to semiconductor layers other than a semiconductor layer to which the first current was applied.

11 Claims, 22 Drawing Sheets

|  | WL0: 5V/5V/5V | WL1 TO WL(m-1): 0V/0V/0V |
|---|---|---|
| BL0: 5V/4V/2V<br>SL0: 0V/0V/0V | MB00<br>SELECTED CONDITION | MB01 TO MB(m-1)<br>HALF-SELECTED CONDITION |
| BL1 TO BL(n-1): 0V/0V/0V<br>SL1 TO SL(n-1): 0V/0V/0V | MB01 TO MB0(n-1)<br>HALF-SELECTED CONDITION | MB11 TO MB(m-1)(n-1)<br>UNSELECTED CONDITION |

FIG. 9

| TIME<br>OPERATION<br>CELL<br>(FUNCTION) | T1<br>PREVIOUS<br>DATA<br>STORE | T2<br>ERASE<br>(SET MC1 TO MC4) | T3<br>PROGRAM 1<br>(RESET MC1) | T4<br>PROGRAM 2<br>(RESET MC2) | T5<br>PROGRAM 3<br>(RESET MC3) | T6<br>PROGRAM 4<br>(RESET MC4) |
|---|---|---|---|---|---|---|
| MC4 (STORE) | 1 OR 0 | 1 | 1 | 1 | 1 | 0 |
| MC3 (STORE) | 1 OR 0 | 1 | 1 | 1 | 0 | 0 |
| MC2 (STORE) | 1 OR 0 | 1 | 1 | 0 | 0 | 0 |
| MC1 (STORE) | 1 OR 0 | 1 | 0 | 1 | 1 | 1 |
| MC0 (ERASE) | 1 | 1 | | | | |

|    | SELECTED CONDITION | UNSELECTED CONDITION |
|----|--------------------|----------------------|
|    | RESET/SET/READ     | RESET/SET/READ       |
| G4 | 0V/—/0V            | 5V/5V/5V             |
| G3 | 0V/—/0V            | 5V/5V/5V             |
| G2 | 0V/—/0V            | 5V/5V/5V             |
| G1 | 0V/—/0V            | 5V/5V/5V             |
| G0 | —/0V/—             | 5V/—/5V              |

FIG. 26

|  | BL0<br>0V/0V/0V | BL1 TO BL(n-1)<br>5V/4V/2V |
|---|---|---|
| ANL0<br>0V/0V/0V | MB00<br>UNSELECTED CONDITION | MB01 TO MB0(n-1)<br>UNSELECTED CONDITION |
| ANL1<br>5V/4V/2V | MB10<br>SELECTED CONDITION | MB11 TO MB1(n-1)<br>UNSELECTED CONDITION |
| ANL2 TO ANL(m-1)<br>0V/0V/0V | MB20 TO MB(m-1)0<br>UNSELECTED CONDITION | MB21 TO MB(m-1)(n-1)<br>UNSELECTED CONDITION |

FIG. 27

|  | SELECTED CONDITION<br>OF CCO IN MB10 | SELECTED CONDITION<br>OF CCE IN MB10 |
|---|---|---|
|  | RESET/SET/READ | RESET/SET/READ |
| CSL0 | 0V/0V/0V | 0V/0V/0V |
| CSL1 | 5V/5V/5V | 0V/5V/0V |
| CSL2 | 0V/5V/0V | 5V/5V/5V |
| CSL3 TO CSLm | 0V/0V/0V | 0V/0V/0V |

FIG. 28

|  | SELECTED CONDITION | UNSELECTED CONDITION |
|---|---|---|
|  | RESET/SET/READ | RESET/SET/READ |
| CGL4 | 0V/0V/0V | 5V/5V/5V |
| CGL3 | 0V/0V/0V | 5V/5V/5V |
| CGL2 | 0V/0V/0V | 5V/5V/5V |
| CGL1 | 0V/0V/0V | 5V/5V/5V |
| CGL0 | —/0V/— | 5V/—/5V |

RESET OPERATING VOLTAGE / READ OPERATING VOLTAGE

US 8,634,257 B2

SEMICONDUCTOR STORAGE DEVICE WITH MEMORY CELL UTILIZED AS A SET-DEDICATED MEMORY CELL

CLAIM OF PRIORITY

The present application claims priority from Japanese patent application JP 2011-105113 filed on May 10, 2011, the content of which is hereby incorporated by reference into this application.

FIELD OF THE INVENTION

The present invention relates to a semiconductor storage device.

BACKGROUND OF THE INVENTION

In a semiconductor storage device including a phase-change memory, a storage element is formed by using a Ge—Sb—Te based chalcogenide material (or phase-change material) containing at least antimony (Sb) and tellurium (Te) as a material of a recording layer. An element for selecting a memory cell is configured by using a vertical MOS transistor.

Japanese Unexamined Patent Application Publication No. 2008-160004 cited below discloses an array configuration in which phase-change memory cells using a chalcogenide material and a vertical MOS transistor are stacked. According to FIG. 3 in the patent document, four memory cells and a vertical transistor TR5 are disposed at points where a word line WL, a bit line BL and a source line SL intersect with each other. Each of the four memory cells has a configuration in which a phase-change element and a vertical transistor are connected in parallel with each other, and are formed on a side wall of a hole (hereinafter, referred to as "interconnect hole") disposed in a stacked layer. These four memory cells are connected in series with the vertical transistor TR5. The word line WL is connected to a gate electrode of the vertical transistor TR5.

SUMMARY OF THE INVENTION

The present inventors have reviewed the high integration of the phase-change memory before filing the present application, and found that there exist problems as mentioned below.

Owing to a progress of photo-lithography, a memory array disclosed by Japanese Unexamined Patent Application Publication No. 2008-160004 is capable of reducing the bottom area of a structure formed at points where the word line WL, the bit line BL and the source line SL intersect with each other. In concert with this, it is desirable to suppress the aspect ratio of the interconnect hole by reducing a length in a direction vertical to the semiconductor substrate in order to facilitate a three-dimensional process.

However, if an interval between upper and lower memory cells becomes narrower, there is a concern that all memory cells in the structure mentioned above may be heated up to a crystallization temperature during a set operation (here, crystallization of the phase-change element) which needs a long current application time. That is, there is a possibility that the Joule heat generated in selected cells may pass through a silicon film serving as a channel of the vertical transistor for selecting memory cells and eventually reach memory cells located above and below selected cells (hereinafter, referred to as "unselected memory cells") and thereby crystallize phase-change elements in the unselected memory cells as well. This means that storage information in unselected cells may be reversed by error and thereby an erroneous write operation occurs.

The present invention is provided to address such problems mentioned above. It is an object of the present invention to suppress the possibility of an erroneous write operation in a semiconductor storage device adopting a phase-change memory which stores information by utilizing the Joule heat.

According to an aspect of the present invention, a semiconductor storage device crystallizes variable resistive element material layers disposed on sides of multiple semiconductor layers in a stacked structure concurrently by applying a first current to any one of the semiconductor layers in the stacked structure and thereafter applying a second current to any other semiconductor layer in the stack other than the semiconductor layer to which the first current is applied.

According to an aspect of the present invention, it is possible to achieve a semiconductor storage device which adopts a large capacity phase-change memory of high integration and high reliability.

BRIEF DESCRIPTION OF THE DRAWINGS

FIG. 9 is a table illustrating how information stored in memory cells MC0 to MC4 changes with the passage of time when writing the information into the memory block MB00;

FIG. 26 is a table showing a relationship of drive voltages in the anode line ANL and the bit line BL;

FIG. 27 is a table showing drive voltages of the cell chain select line CSL;

FIG. 28 is a table showing drive voltages of cell select gate lines CGL0 to CGL4;

DETAILED DESCRIPTION OF THE PREFERRED EMBODIMENTS

Figure 1:
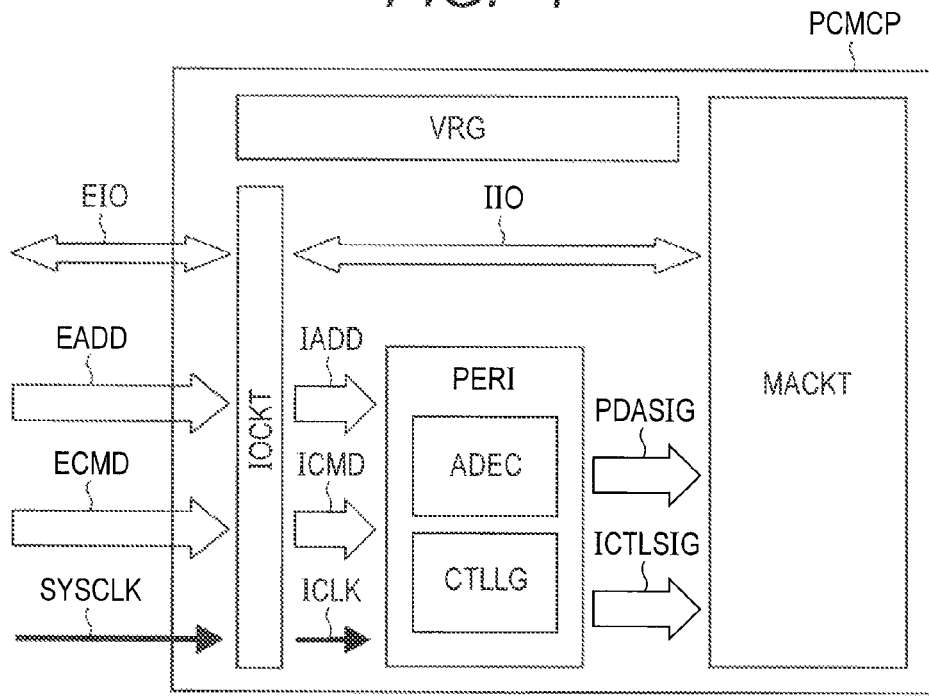
FIG. 1 is a block diagram showing a key part of a phase-change memory chip PCMCP provided in a semiconductor storage device according to a first embodiment.

Hereinafter, embodiments of the present invention are described with reference to the accompanying drawings. Throughout all of the drawings explaining the embodiments, same members are denoted with same reference numerals in principle and repetition of the description thereof is omitted. Circuit elements forming function blocks according to the embodiments are formed on a semiconductor substrate such as a single-crystal silicon by an integrated circuit technique such as a known CMOS (complementary MOS transistor) technique, unless specifically restricted.

First Embodiment

A first embodiment describes a memory array circuit of a phase-change memory using a chalcogenide material for a storage element. The cell array forming a core of the memory array circuit has a configuration in which memory blocks having multiple memory cells connected in series are arranged in a matrix. Each of the memory blocks comprises a memory cell dedicated for the set operation. Utilizing the Joule heat generated in the memory cell, all memory cells in a memory block are put in a set state, that is, a state in which storage elements are crystallized.

In the present application, it is assumed that a memory cell in the set state stores information "1," and a memory cell subjected to the reset operation has a storage element in the amorphous state and stores information "0." When the set pulse current is applied to the memory cell, the set operation is performed, while when the reset pulse current is applied, the reset operation is performed. Differences in those currents are described later.

First Embodiment

Configuration of Memory Cell

FIG. 1 is a block diagram showing a key part of a phase-change memory chip PCMCP provided in a semiconductor storage device according to the first embodiment. The phase-change memory chip PCMCP includes a memory array circuit MACKT, a peripheral circuit PERI, an Input/output circuit IOCKT, and a voltage generator VRG.

The memory array circuit MACKT reads and writes information by using a cell array described later. Peripheral circuits PERI includes an address decoder ADEC and a control logic circuit CTLLG, and generates a pre-decoded address PDASIG and an internal control signal ICLTSIG based on an inputted internal address signal IADD, an internal command signal ICMD and an internal clock ICLK. The Input/output circuit IOCKT transfers an external address signal EADD, an external command signal ECMD and a system clock SYSCLK inputted from the outside of the phase-change memory chip PCMCP, into the phase-change memory chip PCMCP, as an internal address signal IADD, an internal command signal ICMD and an internal clock ICLK. Further, storage information is transmitted and received between an external I/O line EIO and an internal I/O line IIO. A voltage generator VRG generates an application voltage with respect to a control line in the memory array circuit MACKT by using an external power supply (not shown).

First Embodiment

Configuration of Memory Array

Figure 2:
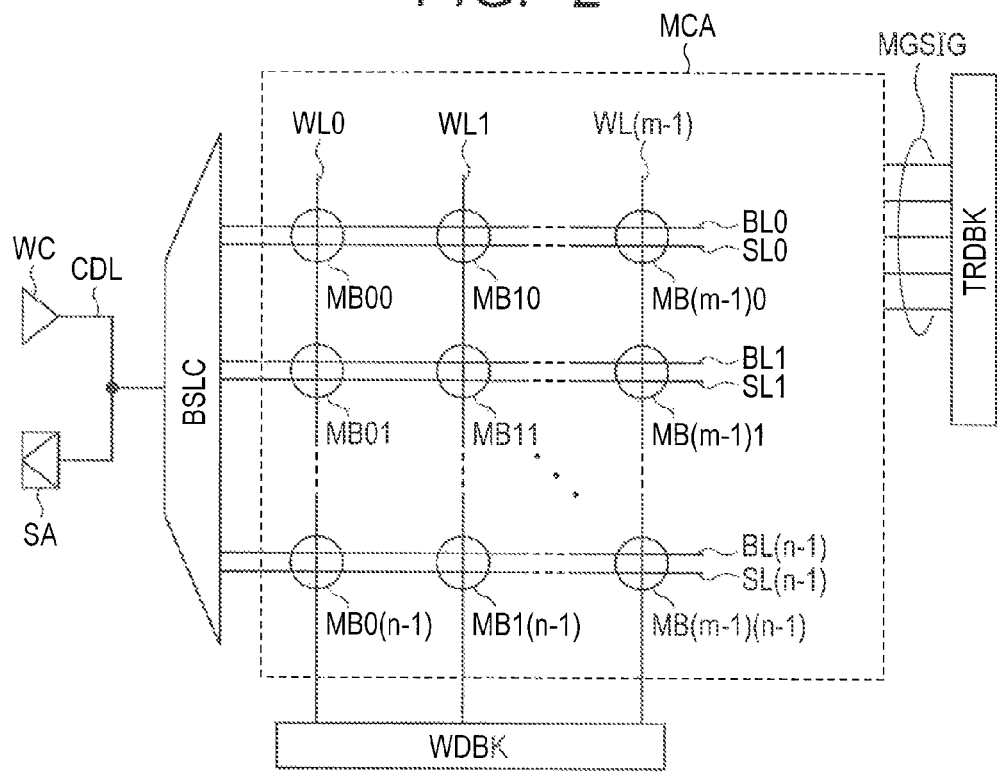
FIG. 2 is a diagram showing a configuration of a memory array circuit MACKT provided in the phase-change memory chip PCMCP shown in FIG. 1.

FIG. 2 is a diagram showing a configuration of a memory array circuit MACKT provided in the phase-change memory chip PCMCP shown in FIG. 1. The memory array circuit MACKT comprises a cell array MCA and direct peripheral circuits thereof. The cell array MCA, as an example, includes (m×n) of memory blocks MB00 to MB(m−1) (n−1) arranged at points where m word lines WL0 to WL(m−1) and n bit lines BL0 to BL(n−1) intersect with each other. As described later, the memory blocks MB00 to MB(m−1) (n−1) comprise multiple memory cells. Further, source lines SL0 to SL(n−1) are arranged so as to be paired with bit lines BL0 to BL(n−1).

Direct peripheral circuits include a sense amplifier SA arranged around the cell array MCA, a write circuit WC, a bit-line selection circuit BSLC, a block of word drivers WDBK and a block of select transistor drivers TRDBK. These circuits and driver groups described later correspond to "current-bias circuit" according to the first embodiment.

The sense amplifier SA and the write circuit WC are connected to any one of bit lines BL0 to BL(n−1) via a common data-line CDL and a bit-line selection circuit BSLC. The bit-line selection circuit BSLC further comprises a function of driving source lines paired with selected bit lines.

The block of word drivers WDBK is a circuit block configured to activate any one of word lines WL0 to WL(m−1). The block of select transistor drivers TRDBK is a driver common to (m×n) memory blocks MB00 to MB (m−1) (n−1), and is connected to the cell array MCA via select-gate signals MGSIG.

Figure 3:
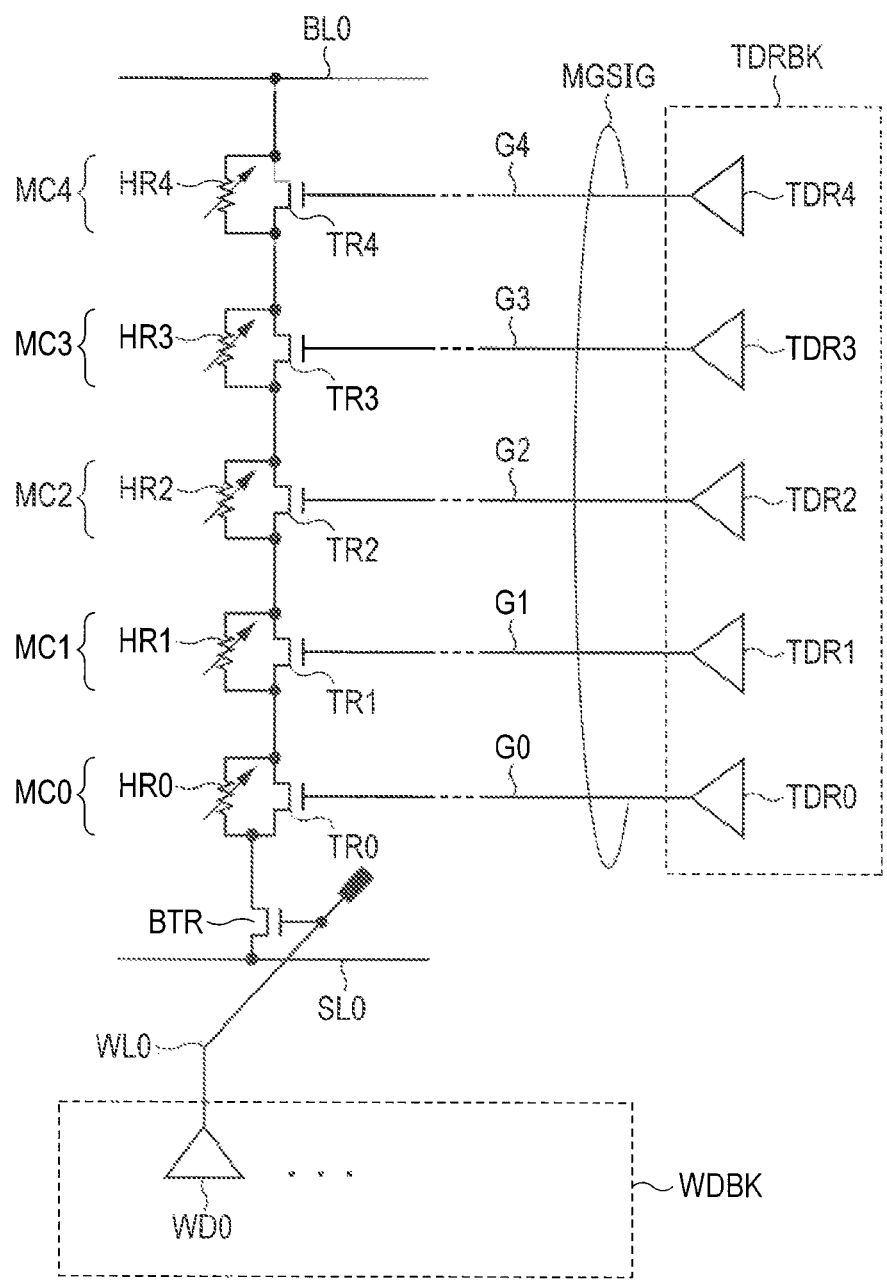
FIG. 3 is a diagram showing a configuration example of a memory block MB00 formed at a point where a word line WL0 and a bit line BL0 intersect with each other.

FIG. 3 is a diagram showing a configuration example of the memory block MB00 formed at a point where the word line WL0 and the bit line BL0 intersect with each other. The memory block MB00 comprises a block select transistor BTR and five memory cells MC0 to MC4.

In the block select transistor BTR, a source electrode is connected to the source line SL0, a drain electrode to the memory cell MC1, and a gate electrode to the word line WL0, respectively. In the first embodiment, a "first select line" corresponds to the word line WL, a "selected element" corresponds to the block select driver transistor BTR, and a "second selected line" corresponds to the bit line BL.

The memory cell MC0 comprises a variable resistive element HR0 made of a chalcogenide material and a select transistor TR0. The memory cell MC1 comprises a variable resistive element HR1 made of a chalcogenide material and a select transistor TR1. The memory cell MC2 comprises a variable resistive element HR2 made of a chalcogenide material and a select transistor TR2. The memory cell MC3 comprises a variable resistive element HR3 made of a chalcogenide material and a select transistor TR3. The memory cell MC4 comprises a variable resistive element HR4 made of a chalcogenide material and a select transistor TR4. The memory cell MC4 is connected directly with the bit line BL0.

A gate electrode of the select transistor TR0 is connected to the select gate control line G0, a gate electrode of the select transistor TR1 to the select gate control line G1, a gate electrode of the select transistor TR2 to the select gate control line G2, a gate electrode of the select transistor TR3 to the select gate control line G3, and a gate electrode of the select transistor TR4 to the select gate control line G4, respectively. Select gate control lines G0 to G4 are elements forming the select gate control line group MGSIG shown in FIG. 2. The block of select transistor drivers TRDBK drives select gate control lines G1 to G4 according to read and write operations with respect to memory cells.

When selecting any one of memory cells MC0 to MC4 shown in FIG. 3, the word line WL0 is turned ON when there is a potential difference between the bit line BL0 and the source line SL0, whereby the block select transistor BTR is electrically connected to perform the ON/OFF drive of select gate control lines G1 to G4.

First Embodiment

Configuration of Cell Array

Next, a configuration example of the cell array in the semiconductor storage device according to the first embodiment is described with reference to FIG. 4 to FIG. 6.

Figure 4:
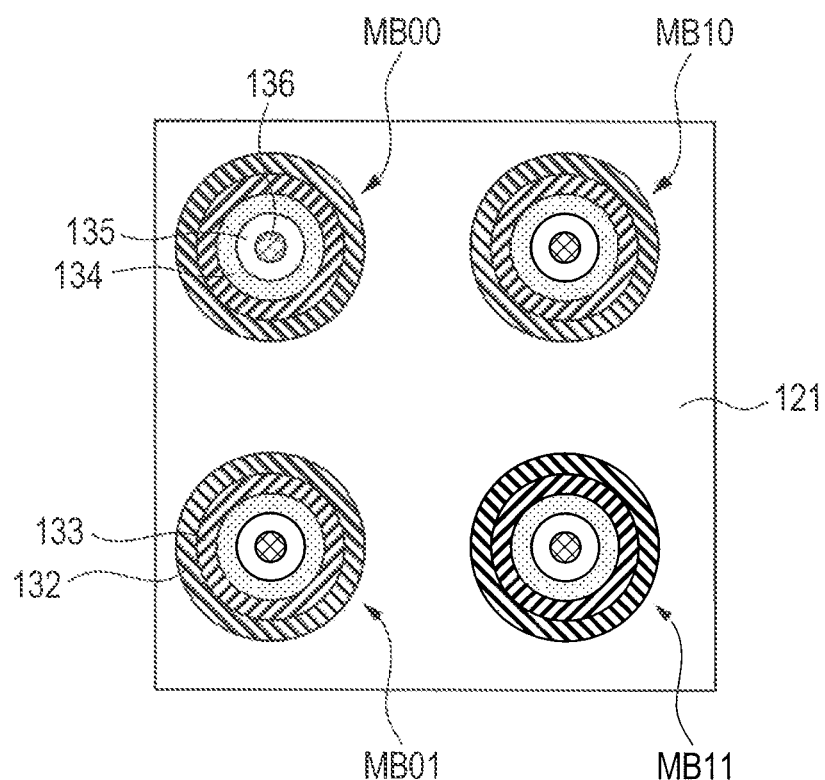
FIG. 4 is a cross sectional view of a cell array MCA which is cut in parallel with a semiconductor substrate in an interlayer insulator 121.

FIG. 4 is a cross-sectional view of the cell array MCA in an interlayer insulator 121 which is cut in parallel with the semiconductor. FIG. 4 corresponds to a cross-sectional view taken along AA' in FIG. 5 and FIG. 6 described later. The interlayer insulator 121 is a film which separates the select transistor TR3 of the memory cell MC3 and the select transistor TR4 of the memory cell MC4 from each other. In FIG. 4, four memory blocks MB00 to MB11 are shown to simplify the description. The interlayer insulator 121 corresponds to an "inter-gate insulating layer" according to the first embodiment.

A silicon film 132 serves as a channel of a vertical transistor for selection of the memory cell. A reaction prevention film 133 suppresses reaction between silicon and a chalcogenide material. A phase-change film 134 serves as a variable resistive element made of a chalcogenide material. An insulating film 135 is a film provided for insulation. A heat dissipation film 136 is a metal film provided to radiate heat generated in the phase-change film 134 for thermal diffusion.

Figure 5:
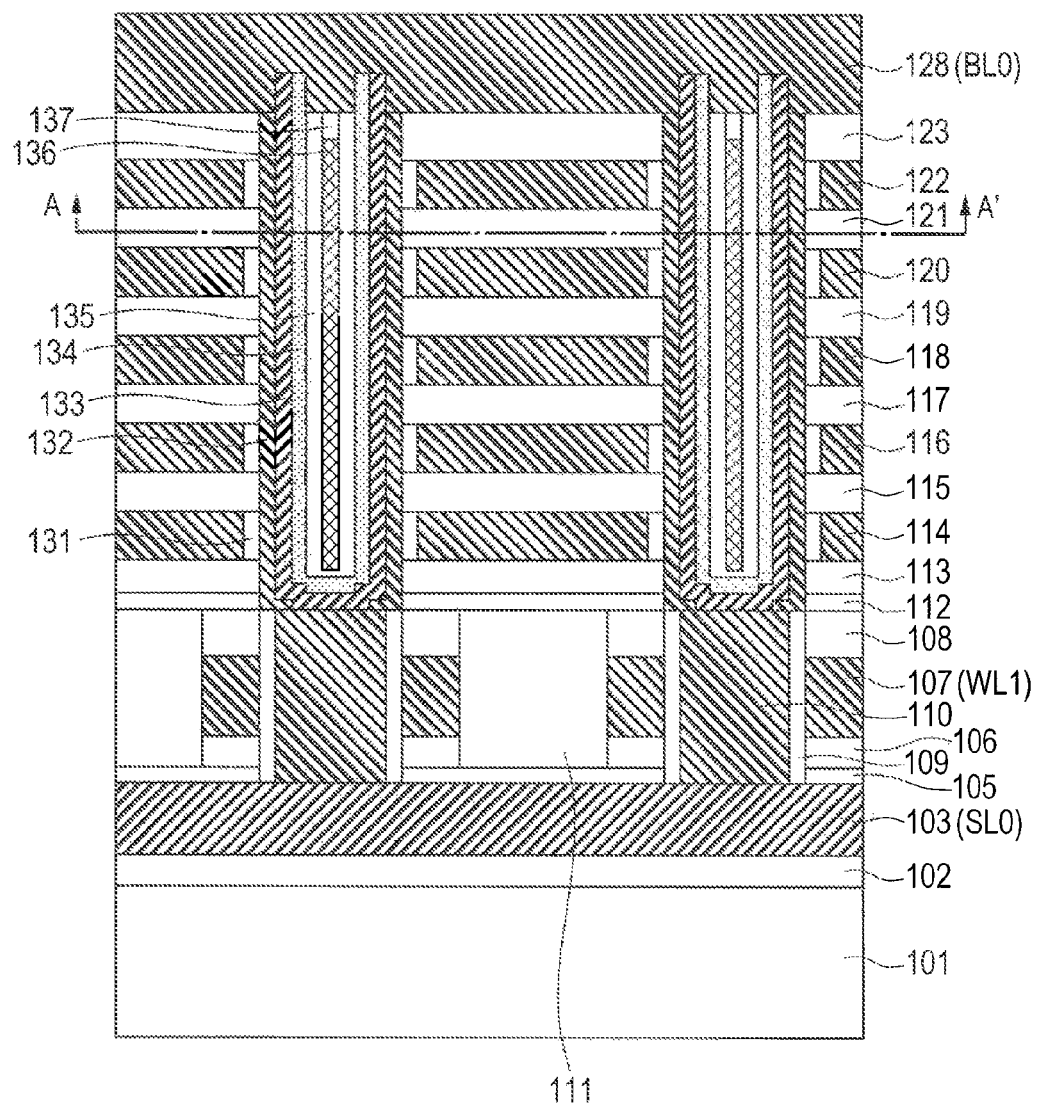
FIG. 5 is a cross sectional view of memory blocks MB00 and MB10 connected to a bit line BL0.
Figure 6:
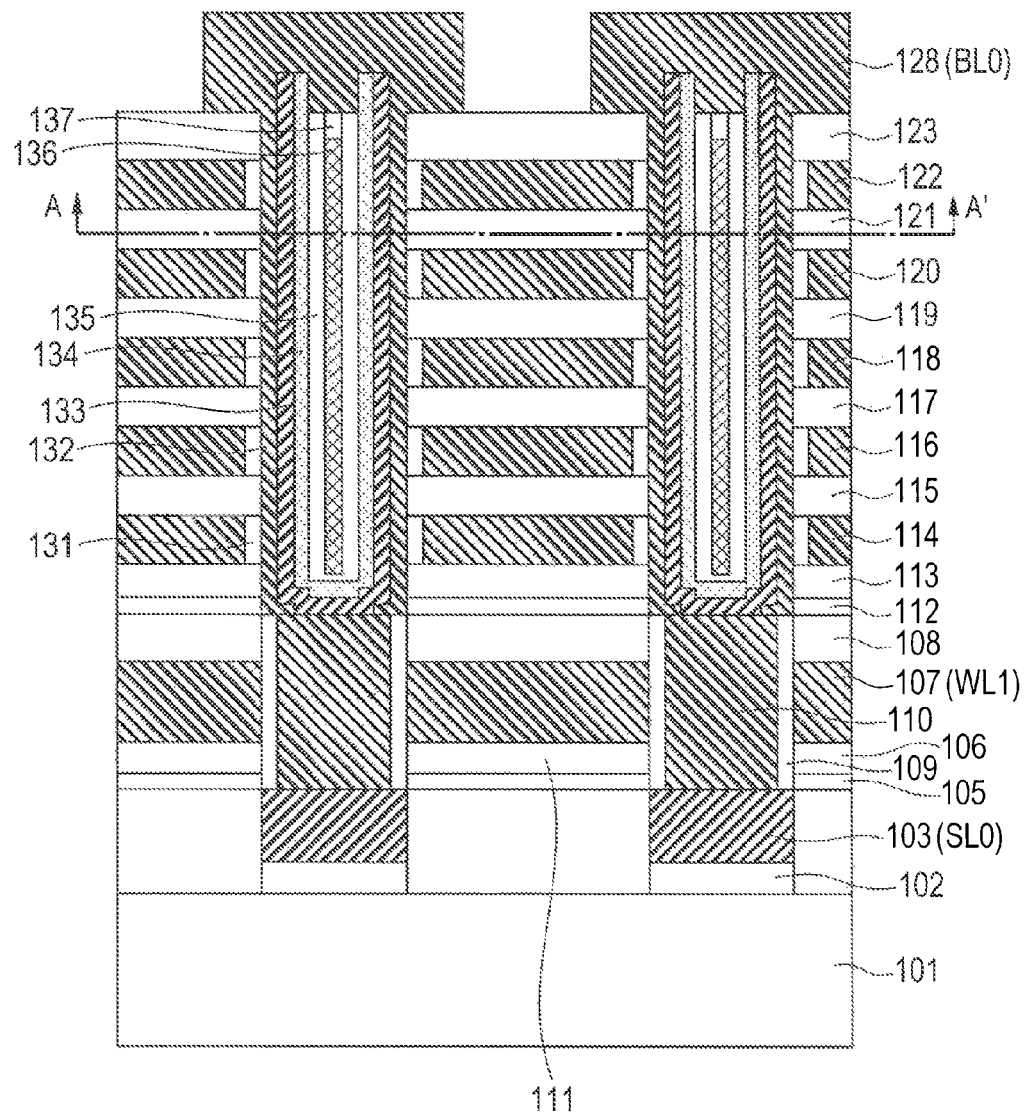
FIG. 6 is a cross sectional view of memory blocks MB11 and MB10 connected to a word line WL1.

FIG. 5 is a cross-sectional view of memory blocks MB00 and MB10 connected to the bit line BL0. FIG. 6 is a cross-sectional view of memory blocks MB11 and MB10 connected to the word line WL1. The interlayer insulator 102 made of silicon oxide is formed on the semiconductor substrate 101, and a metal wiring layer 103 serving as the source line SL0 is formed thereon.

On the metal wiring layer 103, the block select transistor BTR is firstly formed. 105 is an interlayer insulator made of a silicon nitride layer. 106 and 108 are interlayer insulators made of silicon oxide. 107 is a silicon film to which N-type impurities are added, and serves as the word line WL1. 109 is a gate insulating film of the block select transistor BTR. 110 is a silicon film serving as a channel of the block select transistor BTR. 111 is an interlayer insulator made of silicon oxide and exists to separate the block select transistor.

On the block select transistor BTR, memory cells MC0 to MC4 are formed. 112 is a silicon nitride film. 113, 115, 117, 119, 121, 123 and 137 are interlayer insulators made of silicon oxide. 114, 116, 118, 120 and 122 are silicon films to which N-type impurities are added, and serve as select gate control lines G0, G1, G2, G3 and G4. 128 is a metal wiring layer serving as the bit line BL0.

"Semiconductor layers" according to the first embodiment correspond to silicon films 116, 118, 120 and 122, which serve as select gate control lines G1, G2, G3 and G4. "First stacked structure" corresponds to a structure formed by laminating those silicon films.

As above, the configuration of the semiconductor storage device according to the first embodiment is described. Next, a difference between the set pulse current and the reset pulse current is described, and then operation of the semiconductor storage device according to the first embodiment is described.

First Embodiment

Difference Between Set Pulse and Reset Pulse

Figures 7, 8:
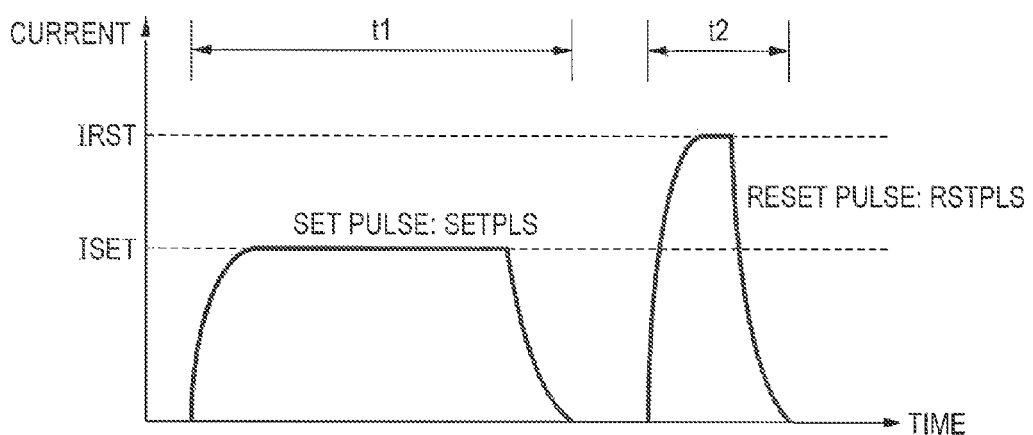
FIG. 7 is a diagram illustrating a difference between a set pulse current and a reset pulse current.
FIG. 8 is a table showing a relationship of drive voltages in the word line WL, the bit line BL and the source line SL.

FIG. 7 is a diagram for explaining a difference between the set pulse current and the reset pulse current. The set pulse current SETPLS is a current applied for maintaining a temperature (for example, about 300° C.) at which the phase-change film forming the memory cell MC is crystallized. The reset pulse current RSTPLS is a current applied for raising the melting point (for example, about 600° C.) of the phase-change film forming the memory cell.

Application time t1 of the set pulse current SETPLS is set longer than application time t2 of the reset pulse current RSTPLS in order to crystallize the memory cell MC by maintaining a crystallization temperature of the phase-change film for a long time.

A current value ISET of the set pulse current SETPLS is smaller than a current value IRST of the reset pulse current RSTPLS. The reset pulse current RSTPLS has a steep rise time so as to turn the memory cell MC to the amorphous state.

If intervals among memory cells MC in a vertical direction are small, Joule heat generated by applying the set pulse current SETPLS to any one of memory cells propagates to upper and lower memory cells MC as well. Thus, when writing information to a memory cell MC by applying the set pulse current SETPLS thereto, the same information is also written into other memory cells MC included in the same memory block MB. Therefore, a certain degree of intervals among memory cells MC needs to be assured in order to prevent erroneous writing. This facilitates a three-dimensional process, and therefore hinders reduction of the aspect in the interconnect hole.

In the first embodiment, in order to address the above problem, information is once written to all memory cells MC by applying the set pulse current SETPLS and thereafter the reset pulse current RSTPLS is applied to a memory cell MC in which the information should not be stored, in order to reset unnecessary information written by the set pulse current SETPLS. Since application time of the reset pulse current RSTPLS is short, so much Joule heat is not transmitted to memory cells MC in the vicinity thereof, and only a specific memory cell MC can be reset. In the first embodiment, erroneous writing is prevented by the above method even when intervals among memory cells MC are small.

As above, the difference between the set pulse current and the reset pulse current and the principle of the semiconductor storage device according to the first embodiment is described. Next, operation of the semiconductor storage device according to the first embodiment is described.

First Embodiment

Operation of Memory Cell Circuit

Hereinafter, an operation example of the cell array in the semiconductor storage device according to the first embodiment is described with reference to FIG. 8 to FIG. 10. Hereinafter, selection of the memory cell MC0 in the memory block MB00 is shown as an example.

FIG. 8 is a table showing a relationship of drive voltages in the word line WL, the bit line BL and the source line SL. Although not shown in FIG. 8, each of word lines WL0 to WL(m−1), bit lines BL0 to BL(n−1) and source lines SL0 to SL(n−1) is driven to the ground voltage of 0 V in a standby mode. Voltage of select gate control lines G0 to G4 is held at 5 V.

The bit-line selection circuit BSLC drives the select bit line BL0 with a voltage corresponding to the operation. Voltage of the bit line BL0 is 5 V in the reset operation, 4 V in the set operation, and 2 V in the read operation. At a same time, the word line held at 0 V is driven to 5 V, whereby the block select transistor BTR is electrically connected to apply a voltage corresponding to the operation to the memory block MB00. In parallel with the memory block select operation described above, a memory cell select operation described next is executed to perform the write operation and the read operation.

FIG. 9 is a table for explaining how information stored in each of the memory cells MC0 to MC4 varies with the passage of time when writing the information into the memory block BL00. Here, an operation example of writing a bit [0] into memory cells MC1 to MC4 which store any information (bit [0] or [1]) is described.

At time T1, memory cells MC1 to MC4 store information recorded in the past (that is, previous data). The memory MC0 is not a memory for storing information, but a memory cell for writing the same information to memory cells MC1 to MC4 concurrently by applying the set pulse current SETPLS. Therefore, the memory cell MC0 always stores the bit [1].

At time T2, the memory cell MC0 is selected, and thereafter the set pulse current SETPLS is applied to the memory cell MC0. At that time, variable resistive elements HR1 to HR4 of memory cells MC1 to MC4 are crystallized by Joule heat generated in the memory cell MC0, whereby the bit [1] is written into memory cells MC1 to MC4 concurrently.

At times T3 to T6, memory cells MC1 to MC4 are selected sequentially, and the reset pulse current RSTPLS is applied to each of the memory cells, whereby variable resistive elements HR1 to HR4 of memory cells MC1 to MC4 turn to the amorphous state and the bit [0] is written into the memory cells sequentially.

Figure 10:
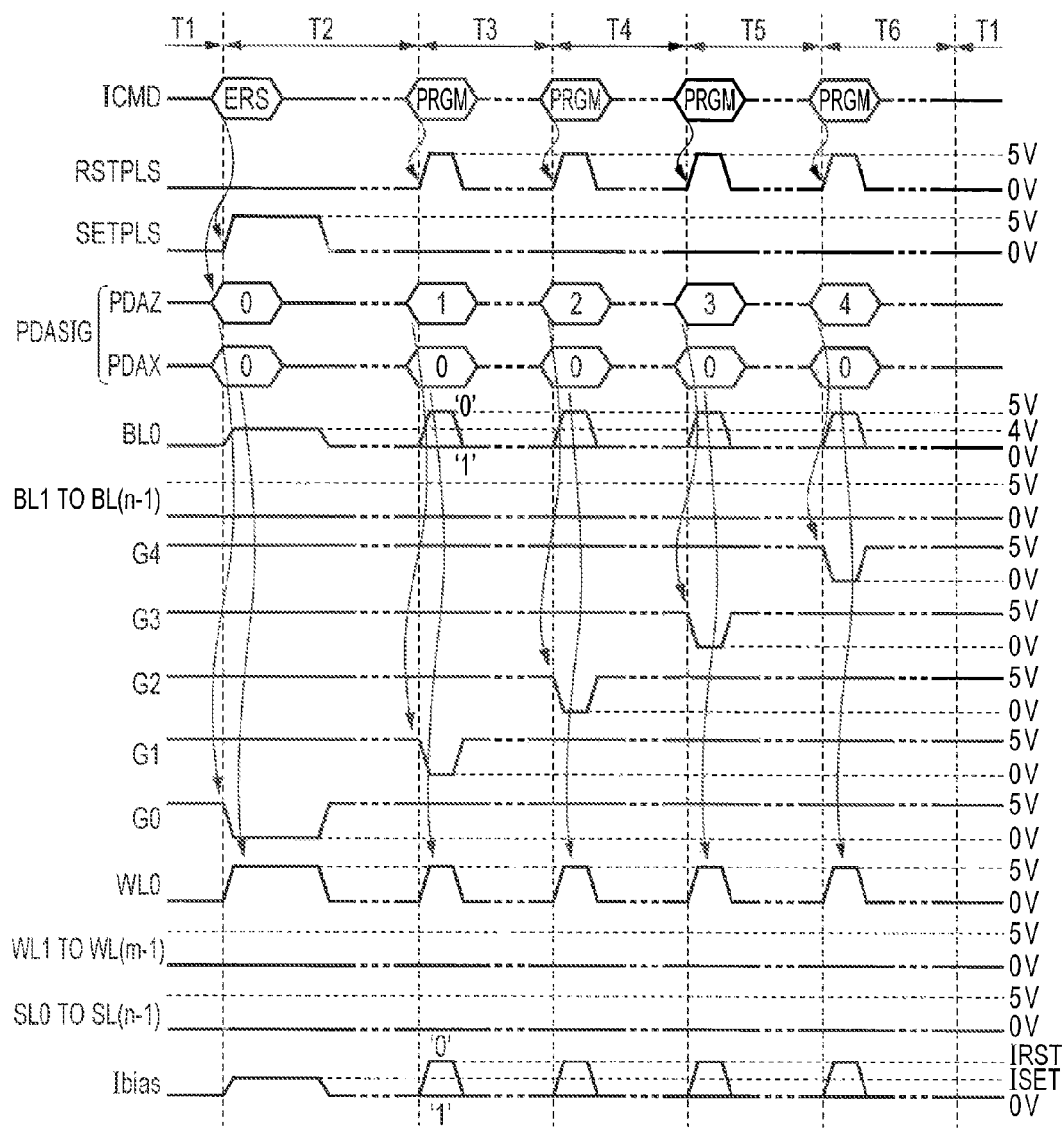
FIG. 10 is a time chart showing how respective elements operate in operations shown in FIG. 9.

FIG. 10 is a time chart showing operations of respective elements in the operation shown in FIG. 9. Hereinafter, operations at respective times shown in FIG. 10 are described.

At time T2, operation of writing the bit [1] into memory cells MC1 to MC4 concurrently is performed. That is, when an erase command ERS is generated on the internal command signal ICMD, the set pulse signal SETPLS is generated. At that time, the select gate control line G0 held at 5 V is driven to the ground voltage of 0 V to turn off the select transistor TR0 of the memory cell MC0 in memory blocks MB00 to MB(m−1) (n−1). In parallel with the operation of selecting the memory cell MC00, the memory block MB00 is selected. That is, the word line WL0 and the bit line BL0 are driven to 5 V and 4 V respectively. In such a manner, the memory block MB00 and the memory cell MC0 are selected, and the set pulse current SETPLS is applied to the variable resistive element HR0 of the memory cell MC0.

At time T3, operation of writing the bit [0] to the memory cell MC1 (reset operation) is performed. That is, when a recording command PRGM is generated on the internal command signal ICMD, the reset pulse signal RSTPLS is generated. At that time, the select gate control line G1 held at 5 V is driven to the ground voltage of 0 V to turn off the select transistor TR1 of the memory cell MC1 in memory blocks MB00 to MB(m−1) (n−1). In parallel with the operation of selecting the memory cell MC00, the memory block MB00 is selected. That is, the word line WL0 and the bit line BL0 are driven to 5 V respectively. In such a manner, the memory block MB00 and the memory cell MC1 are selected, and the reset pulse current RSTPLS is applied to the variable resistive element HR1 of the memory cell MC1.

When the reset pulse current RSTPLS is applied to the memory cell MC1, the variable resistive element HR1 of the memory cell MC1 turns to an amorphous state due to Joule heat generated in the memory cell MC1. That is, information stored in the memory cell MC1 turns to [0]. Since application time of the reset pulse current RSTPLS is sufficiently shorter than application time of the set pulse current SETPLS, Joule heat stays in the vicinity of the memory cell MC1 and does not diffuse to peripheral memory cells. Therefore, information [0] can be recorded selectively to the memory cell MC1.

At times T4 to T6, information [0] can be written to memory cells MC2 to MC4 by performing the same process with respect to the memory cells. In the above, an example of writing the information [0] to memory cells MC1 to MC4 is described. However, when writing the information [1], the reset pulse current RSTPLS needs not to be applied. That is, voltage of the bit line BL0 is held at 0 V to keep the memory cells in the crystallized state.

Figure 11:
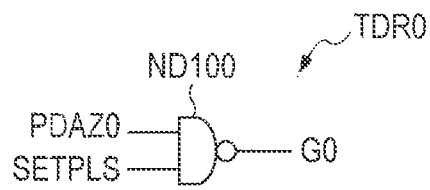
FIG. 11 is a configuration diagram of a selected transistor drive circuit TRD0 in a block of select transistor drivers TRDBK.

FIG. 11 is a configuration diagram of the select transistor drive circuit TRD0 in the block of select transistor drivers TRDBK. The select gate control line G0 is driven by the select transistor drive circuit TRD0 in the block of select transistor drivers TRDBK shown in FIG. 3.

The select transistor drive circuit TRD0 comprises a two-input NAND circuit ND100. An input terminal of the two-input NAND circuit ND100 is connected with a pre-decode signal PDAZ0 in a pre-decoded address PDASIG activated in accordance with the erase command ERS. Another input terminal is connected with the set pulse signal SETPLS. An output terminal of the select transistor drive circuit TRD0 is connected to the select gate control line G0.

Figure 12:
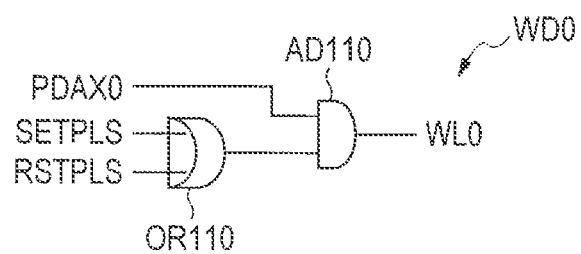
FIG. 12 is a configuration diagram of a word driver WD0 in a block of word drivers WDBK.

FIG. 12 is a configuration diagram of the word driver WD0 in the block of word drivers WDBK. The word line WL0 is driven by the word driver WD0 in the block of word drivers WDBK shown in FIG. 3.

The word driver WD0 comprises an OR circuit OR110 and an AND circuit AD110. An input terminal of the OR circuit OR110 is connected with the set pulse current SETPLS and the reset pulse current RSTPLS respectively. An input terminal of the AND circuit AD110 is connected with an output signal of the OR circuit OR110 and the pre-decode signal PDAX0 in the pre-decoded address PDASIG respectively. An output terminal of the AND circuit AD110 is connected with the word line WL0.

Figure 13:
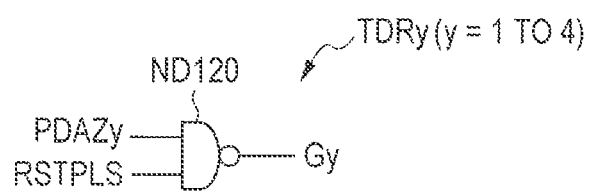
FIG. 13 is a configuration diagram of selected transistor drive circuits TRD1 to TRD4 in a block of select transistor drivers TRDBK.

FIG. 13 is a configuration diagram of select transistor drive circuits TRD1 to TRD4 in the block of select transistor drivers TRDBK. Select gate control lines G1 to G4 are driven by select transistor drive circuits TRD1 to TRD4 in the block of select transistor drivers TRDBK shown in FIG. 3. Hereinafter, a configuration of the select transistor drive circuit TRD1 is described as an example.

The select transistor drive circuit TRD1 comprises a NAND circuit ND120. An input terminal of the NAND circuit ND120 is connected with a pre-decode signal PDAZ1 in the pre-decoded address PDASIG and the reset pulse current RSTPLS. An output terminal of the NAND circuit ND120 is connected with the select gate control line G1.

Figures 14, 15:
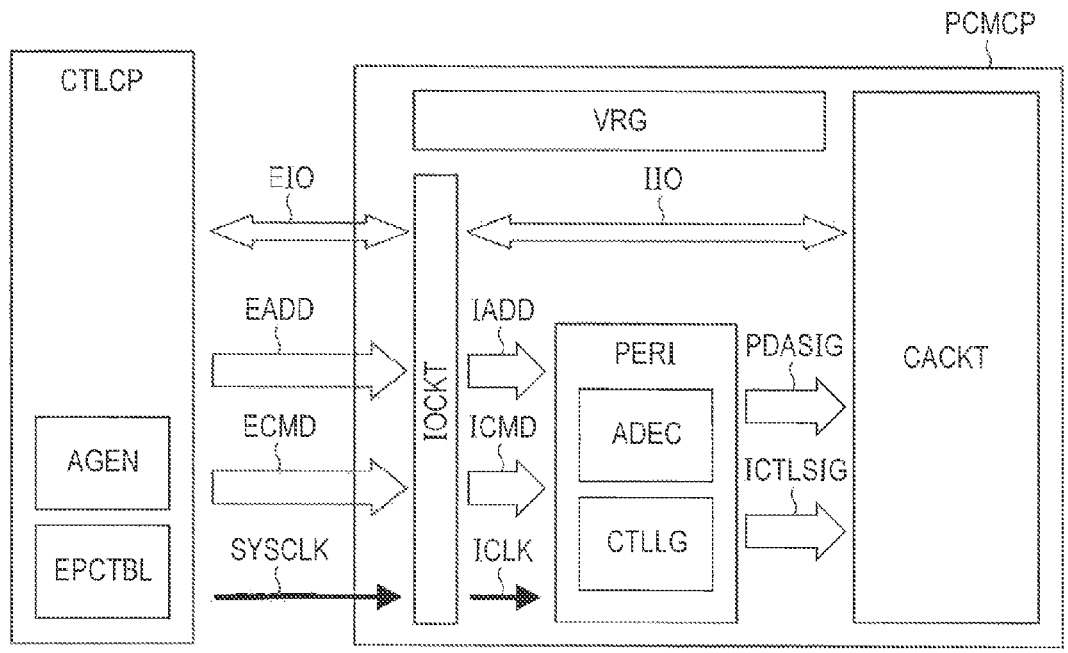
FIG. 14 is a table summarizing voltages applied to selected gate control lines G0 to G4 in operations described with reference to FIG. 9 and FIG. 10.
FIG. 15 is a diagram showing a configuration example of a memory module provided into a semiconductor storage device according to a second embodiment.

FIG. 14 is a diagram summarizing voltages applied to select gate control lines G0 to G4 in operations described with reference to FIG. 9 to FIG. 10. Since the set pulse current SETPLS is applied to the memory cell MC0, only voltage applied in the set operation is defined for the select gate control line G0. Since the reset pulse current RSTPLS is applied to memory cells MC1 to MC4, only voltage applied in the reset operation (and read operation) is defined for select gate control lines G1 to G4.

First Embodiment

Summary

As described above, the semiconductor storage device according to the first embodiment comprises a set-dedicated memory cell MC0 in a memory block MB. By utilizing Joule heat generated by applying the set pulse current SETPLS to the memory cell MC0, same information is written concurrently into memory cells MC1 to MC4 in a same memory block MB, and then the reset operation is performed with respect to memory cells out of memory cells MC1 to MC4 in which the information should not be stored. Since reset operation time is shorter than set operation time, diffusion to peripheral memory cells of Joule heat generated by applying the reset pulse current is suppressed, whereby the information [0] can be written selectively.

That is, the semiconductor storage device according to the first embodiment is capable of preventing erroneous writing even when intervals among memory cells are reduced to an extent that Joule heat generated by applying the set pulse current SETPLS to the memory cell MC0 propagates to peripheral memory cells. Further, write operation time with respect to a memory block MB can be reduced by erasing memory cells MC1 to MC4 at a same time. In particular, when the information [1] is stored in many memory cells, the write operation time can be further reduced since the number of times applying the reset pulse current RSTPLS is reduced.

Further, the semiconductor storage device according to the first embodiment is capable of suppressing process costs since the set-dedicated memory cell MC0 has a configuration same as memory cells MC1 to MC4.

Although the memory cell MC0 is provided as a set-dedicated memory cell according to the first embodiment, two or more memory cells may be provided as set-dedicated memory cells. By increasing the number of set-dedicated memory cells, application time of the set pulse current SETPLS with respect to information storage memory cells MC1 to MC4 can be reduced, and as a result, deterioration of electric properties in the information storage memory cells can be suppressed. In the set-dedicated memory cells, degree of deterioration of electric properties is low since there is no need to re-write information and storage elements are always kept in a stable crystallized state.

Although the memory cell MC0 at a lowest layer in the memory block is used as a set-dedicated memory cell according to the first embodiment, the memory cell at the lowest layer needs not to be necessarily the set-dedicated memory cell. For example, same effects as the first embodiment can be achieved by changing functions between memory cells MC0 and MC1.

Second Embodiment

In the second embodiment of the present invention, a configuration example of changing a set-dedicated memory cell each time when writing is performed a predetermined number of times is described.

Second Embodiment

Configuration of Memory Module

FIG. 15 is a diagram showing a configuration example of a memory module provided in a semiconductor storage device according to the second embodiment. The memory module comprises a phase-change memory chip PCMCP and a controller chip CTLCP. Those circuits correspond to "current-bias circuits" according to the second embodiment.

The controller chip CTLCP controls read and write operations of the phase-change memory chip PCMCP. That is, the controller chip CTLCP transmits and receives input/output data and controls the external address signal EADD, the external command signal and the system clock SYSCLK.

The controller chip CTLCP comprises a table EPCTBL and an address generator AGEN.

The table EPCTBL stores the number of times of erasing (the number of times of writing the information [1] concurrently by applying the set pulse current) and the number of times of recording (the number of times of writing the information [0] by applying the reset pulse current) performed with respect to memory blocks in the phase-change memory chip PCMCP.

The address generator AGEN generates addresses corresponding to the number of times of erasing and the number of times of recording stored in the table EPTBL. That is, a memory cell performing information writing can be changed according to the number of times of erasing and the number of times of recording by generating a different address according to the number of times of erasing and the number of times of recording.

Second Embodiment

Configuration and Operation of Memory Cell Circuit

Hereinafter, a configuration and operation of the memory array circuit is described. The memory array circuit according to the second embodiment is characterized by a configuration of a memory block used in the cell array and an erase operation thereof (here, an operation of writing the information [1]).

Figure 16:
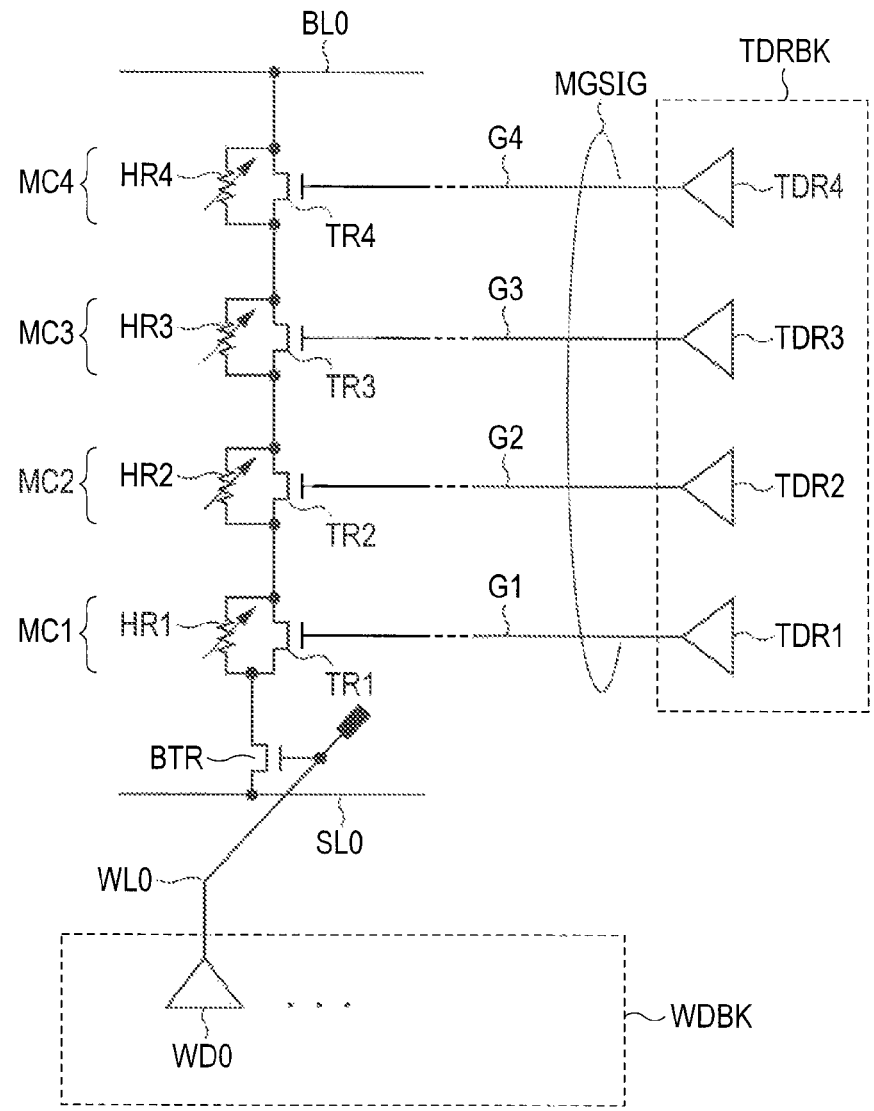
FIG. 16 is a diagram showing a configuration example of a memory block MB00 according to the second embodiment.

FIG. 16 is a diagram showing a configuration example of the memory block MB00 according to the second embodiment. The memory block MB00 according to the second embodiment does not include a set-dedicated memory cell MC0 such as the one according to the first embodiment, but only information storage memory cells MC1 to MC4. The controller chip CTLCP selects one memory cell used for the set operation out of memory cells MC1 to MC4. Further, the controller chip CTLCP changes a memory cell used for the set operation according to the number of times of erasing and the number of times of recording performed with respect to the memory block MB00.

Figure 17:
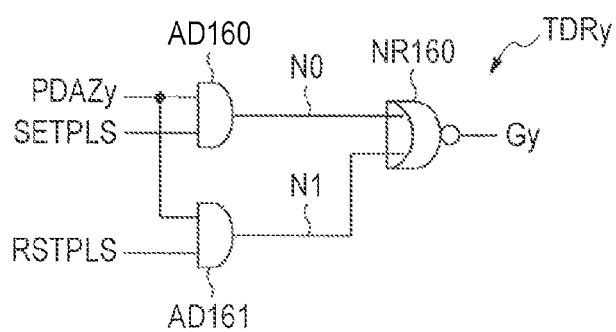
FIG. 17 is a diagram showing a configuration example of a selected transistor drive circuit TRDy (y=1 to 4) in the block of select transistor drivers TRDBK shown in FIG. 15.

FIG. 17 is a diagram showing a configuration example of a select transistor drive circuit TRDy (y=1 to 4) in the block of select transistor drivers TRDBK shown in FIG. 15.

The drive circuit TRDy (y=1 to 4) comprises two AND circuits AD160 and AD161 and a NOR circuit NR160. An input terminal of the AND circuit AD160 is connected with a pre-decode signal PDAZy in the pre-decoded address PDASIG and the set pulse current SETPLS. An input terminal of the AND circuit AD161 is connected with the set pulse current SETPLS and the reset pulse current RSTPLS. An input terminal of the NOR circuit NR160 is connected with an output signal of the AND circuit AD160 and an output signal of the AND circuit AD161. An output terminal of the NOR circuit NR160 is connected with a select gate control line Gy.

Figure 18:
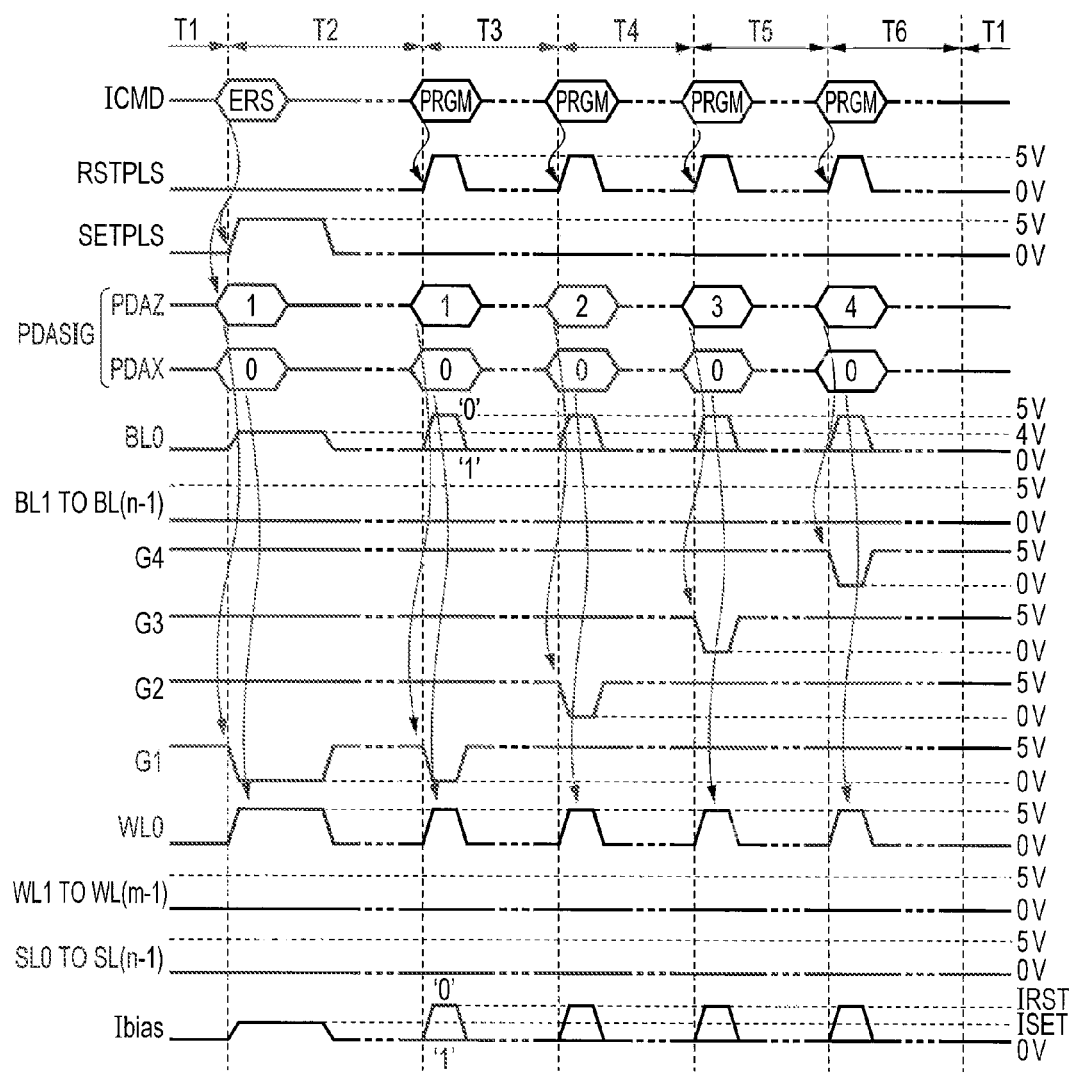
FIG. 18 is a time chart showing operations of respective elements when the semiconductor storage device according to the second embodiment performs the write operation.

FIG. 18 is a time chart showing operations of respective elements when the semiconductor storage device according to the second embodiment performs the write operation. Here, an operation example using the memory cell MC1 as a set operation memory cell is shown as an example.

Similarly with FIG. 10, when an erase command ERS is generated on the internal command signal ICMD, the set pulse signal SETPLS is generated. On the other hand, the controller chip CTLCP shown in FIG. 15 activates the pre-decoded address PDAZ1 by generating external addresses according to the number of times of erasing and the number of times of recording in the memory block MB00.

As a result, the select transistor drive circuit TRD1 shown in FIG. 17 drives the select gate control line G0 held at 5 V to the ground voltage of 0 V to turn off the select transistor TR1 of the memory cell MC1 in memory blocks MB00 to MB(m−1) (n−1). At a same time, the word line WL0 held at the ground voltage of 0 V is driven to 5 V, and the block select transistor BTR in the memory block MB00 is electrically connected, whereby the set pulse current SETPLS is applied to the variable resistive element HR1 of the memory cell MC1 in the memory block MB00.

When the set pulse current SETPLS is applied to the memory cell MC1, variable resistive elements HR1 to HR4 of memory cells MC1 to MC4 are crystallized by Joule heat generated in the memory cell MC1. That is, information stored in memory cells MC1 to MC4 turns to [1]. At times T3 to T6, operation of recording information to memory cells MC1 to MC4 (here, reset operation of writing the information [0] by applying the reset pulse current RSTPLS) is performed similarly with operations shown in FIG. 10.

The controller chip CTLCP may determine a memory cell used for the set operation by using either of the following methods. For example, a memory cell used for the set operation a predetermined number of times may be replaced with a next memory cell, or a memory cell used for the set operation may be selected randomly. However, since changing the memory cell for the set operation each time of the write operation is not efficient, it is preferable that a same memory cell is used continuously up to a predetermined number of times even if a memory cell used for the set operation is selected randomly.

Second Embodiment

Summary

As described above, the semiconductor storage device according to the second embodiment does not include a set-dedicated memory cell and writes information concurrently to all memory cells in a memory block by performing the set operation using any one of memory cells MC1 to MC4. Thereafter, the reset pulse current RSTPLS is applied to a memory cell, out of memory cells MC1 to MC4, in which the bit [0] should be stored. In such a manner, same operations as the first embodiment can be achieved.

Further, the semiconductor storage device according to the second embodiment selects a memory cell for the set operation according to the number of times of erasing and the number of times of recording stored in the table EPCTBL. In such a manner, concentrated application of the set pulse current SETPLS to a specific memory cell can be prevented. That is, deterioration of electric properties of memory cells to which the set pulse current SETPLS is applied can be suppressed.

Further, the semiconductor storage device according to the second embodiment comprises no set-dedicated memory cell and is capable of eliminating a set-dedicated memory by performing the set operation using anyone of memory cells MC1 to MC4, whereby process costs for the phase-change memory chip PCMCP can be reduced. Therefore, the semiconductor storage device according to the second embodiment is preferably used in a phase-change memory in an application requiring a low cost rather than the reliability.

The second embodiment achieves a function of storing the number of times of erasing and the number of times of recording with respect to a memory cell and a function of generating addresses according to the number of times of erasing and the number of times of recording, using the controller chip CTLCP. Those functions may be achieved by using component elements other than the controller chip CTLCP. For example, if a same function is mounted in the phase-change memory chip PCMCP, a memory module of a lower cost can be achieved by reducing the cost of the controller chip CTLCP with fewer functions thereof.

Third Embodiment

In a third embodiment of the present invention, another configuration example of the memory array circuit MACKT is described. In the third embodiment, two cell chains comprising a structure same as the first embodiment are configured in a pair so as to double the number of bits which one interconnect hole is capable of storing. In the third embodiment, a configuration example in which each of the cell chains comprises a set-dedicated memory cell same as the first embodiment is described. However, a configuration not having a set-dedicated memory similarly with the second embodiment may be adopted.

Third Embodiment

Configuration of Memory Array Circuit

Figure 19:
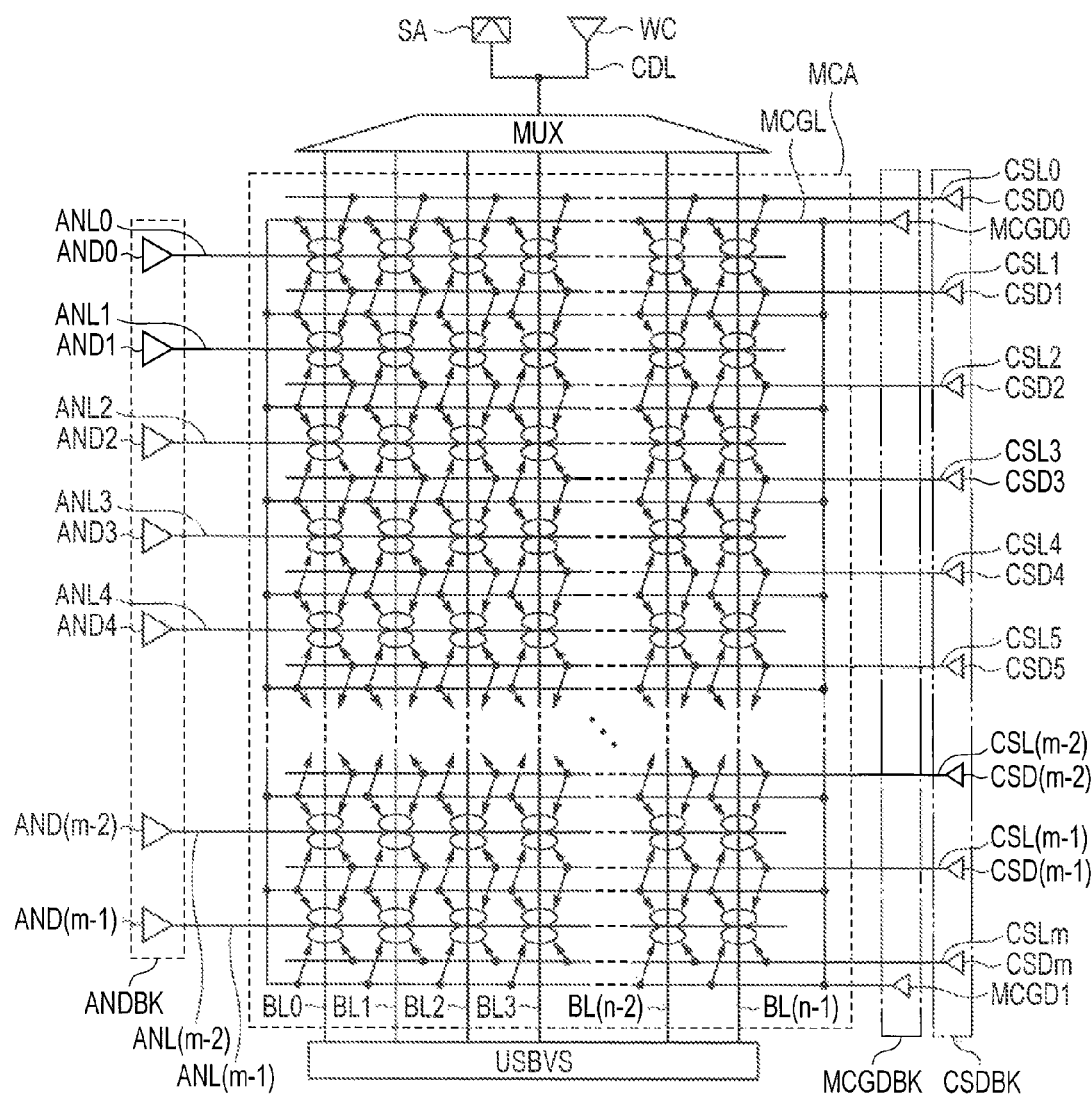
FIG. 19 is a diagram showing a cell array MCA and direct peripheral circuits according to a third embodiment.

FIG. 19 is a diagram showing a cell array MCA and direct peripheral circuits according to the third embodiment. First, a configuration of the cell array MCA is described hereinafter.

The cell array MCA comprises a matrix of m columns and n rows by m anode lines ANL0 to ANL(m−1) and n bit lines BL0 to BL(n−1)[.] (m and n are natural numbers), and a memory cell group MB00 to MB(m−1) (n−1) is arranged at intersecting points in a matrix having m columns and n rows (hereinafter, the memory cell group MB is called as "memory block").

Each of the memory blocks MB includes a pair of cell chains described later. In FIG. 19, each of two ellipses provided at points where an anode line ANL and a bit line BL intersect with each other corresponds to one cell chain, and a set of two ellipses is a memory block MB. In FIG. 19, the memory block MB00 provided at a point where the anode line ANL0 and the bit line BL0 intersects with each other is shown as a representative example.

Next, detail of each memory block MB is described. First, a diode PD is connected to each of m anode lines (refer to FIG. 20 described later). Then, a pair of cell chains is connected in series with the diode PD.

In the third embodiment, the cell chain refers to a structure in which five memory cells MC0 to MC4 are connected in series in a Z axis direction. The Z axis direction is a height direction with respect to the semiconductor substrate, a direction vertical to both the anode line ANL and the bit line BL. Therefore, in each of m×n memory blocks MB, 10 (=5×2) memory cells corresponding to a pair of cell chains are connected in series with the diode PD mentioned above. As a result, the cell array MCA according to the third embodiment comprises m×n×5×2 memory cells.

A bit-line selection circuit BSLC and an unselect bit line voltage supply circuit USBVS are connected to both ends of bit lines BL0 to BL(n−1) respectively. The bit-line selection circuit BSLC is electrically connected to a common data-line CBL by selecting any one of bit lines BL0 to BL(n−1). The common data-line CDL is connected with a re-write circuit WC and a sense amplifier SA which re-writes memory cell information selected from the memory array MA mentioned above and reads information thereof. The unselect bit line voltage supply circuit USBVS supplies unselect voltage to all bit lines in the standby mode and to (n−1) bit lines excluding selected bit lines in the read operation and the write operation. Detail thereof is described when operation of the memory array circuit is described. This voltage supply mechanism prevents erroneous writing to a cell chain other than those selected. Those circuits and driver groups described later correspond to "current-bias circuits" according to the third embodiment.

Third Embodiment

Circuit Configuration of Cell Chain

Figure 20:
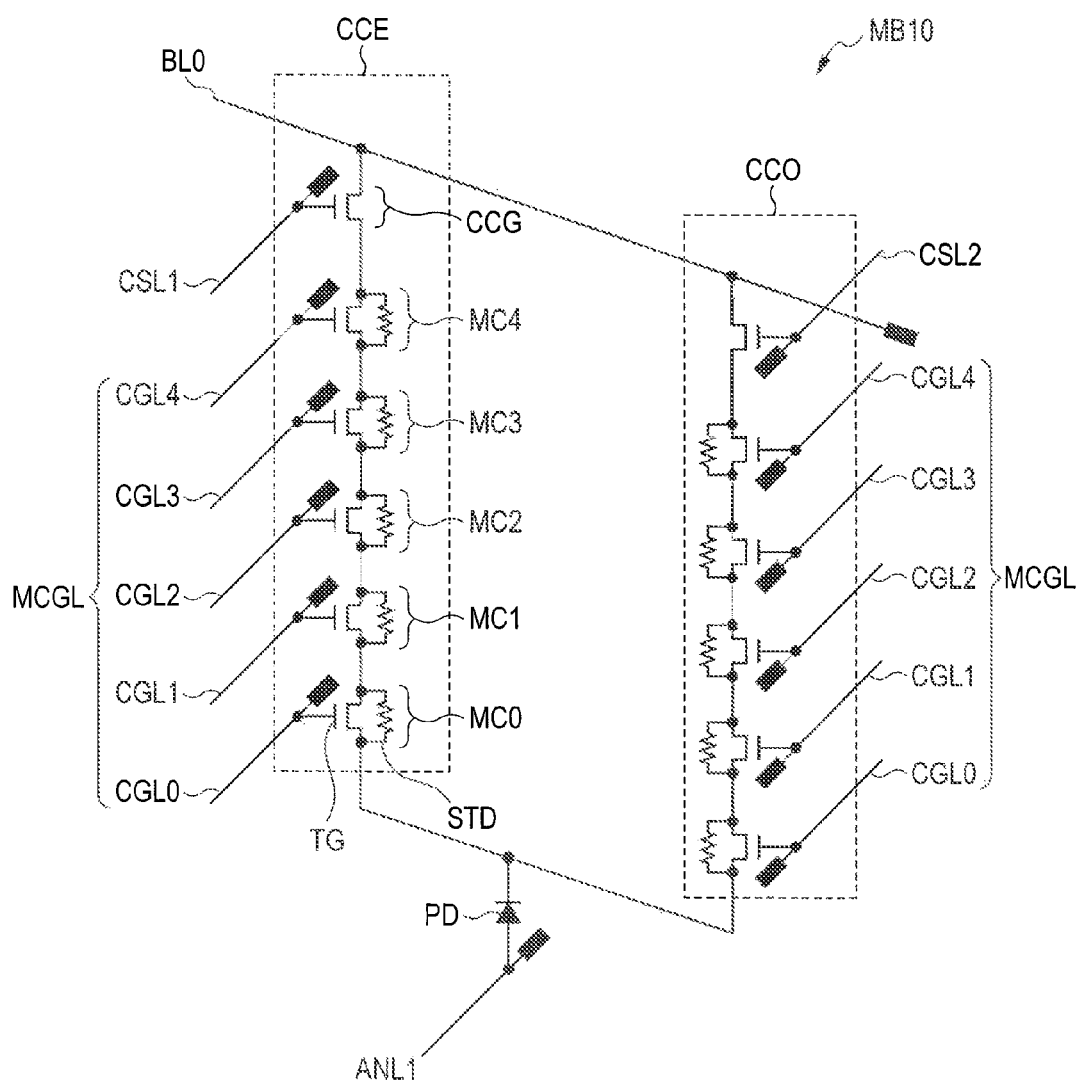
FIG. 20 is a diagram showing detail of the circuit configuration of the memory block MB10 at a point where the anode line ANL1 and the bit line BL0 intersects with each other in the memory array shown in FIG. 19.

FIG. 20 is a diagram showing details of a circuit configuration of the memory block MB10 at a point where the anode line ANL1 and the bit line BL0 intersects with each other in the memory array shown in FIG. 19. In this circuit configuration, a polysilicon diode PD connected to the anode line ANL1 is connected in series with two cell chains CCE and CCO arranged in parallel with each other.

Cell chains CCE and CCO comprise five memory cells MC0 to MC4 and a cell chain select transistor CCG connected in series with one another.

Memory cells MC0 to MC4 comprise MOS transistors TG serving as transmission gates and storage elements STD of a variable resistive element type. In each of the memory cells MC, a source-drain path of the MOS transistor TG and a storage element STD are connected in parallel with each other. A gate electrode of the MOS transistor TG serving as a transmission gate of the memory cells is connected with one line in the cell select gate line group MCGL. Further, the cell chain select transistor CCG is connected with the cell chain select line CSL.

In the cell chain CCO, memory cells MC0 to MC4 are drive-controlled by cell select gate lines CGL0 to CGL4 which are members forming the cell select gate line group MCGL. The cell chain select MOS transistor CCG is drive-controlled by the cell chain select line CSL1. In a same manner, in the cell chain CCE, memory cells MC0 to MC4 are drive-controlled by cell select gate lines CGL0 to CGL4 which are members forming the cell select gate line group MCGL. The cell chain select MOS transistor CCG is drive-controlled by the cell chain select line CSL2.

Next, the cell chain select line CSL and the cell select gate line group MCGL are described. As described above, the cell array MCA according to the third embodiment comprises a pair of cell chains in each matrix of m columns and n rows (that is, 10 memory cells). Therefore, a selected/unselected condition of a memory cell cannot be identified just by identifying the column m and the row n. A wiring group for identifying this is the cell chain select line CSL and the select cell gate line group MCGL.

First, the cell chain select line CSL selects either one out of a pair of cell chains. In FIG. 19, arrows are denoted from each of cell chain select lines CSL to either of two ellipses. Those arrows indicate which one out of the pair of cell chains is selected.

Further, in FIG. 19, a cell chain select line CSL is connected in common to two cell chains adjacent to each other. For example, an xth cell chain select line CSLx selects both a cell chain connected to an anode line ANL(x−1) and a cell chain connected to an anode line ANLx. That is, when x is an even number, a cell chain select line CSLx is connected to both a cell chain select transistor CCG contained in a cell chain CCE connected to an anode line ANL(x−1) and a cell chain select transistor CCG contained in a cell chain CCE connected to an anode line ANLx. When x is an odd number, a cell chain select line CSLx is connected to a cell chain select transistor CCG contained in a cell chain CCO connected to an anode line ANL(x−1) and a cell chain select transistor CCG contained in a cell chain CCO connected to an anode line ANLx.

Even if one of a pair of cell chains is selected, the cell chain further contains five memory cells MC. Therefore, a memory cell MC which is selected needs to be identified. Thus, a memory cell to be selected out of five memory cells contained in the cell chain is identified by the select gate line group MCGL. In FIG. 19, the select cell gate line group MCGL is denoted as one wiring GSL respectively, which is, however, a notation for simplification purpose, and is actually a wiring group consisting of five lines as shown in FIG. 20. Memory cells can be selected or unselected by applying select or unselect voltage to each of the five lines.

In FIG. 19, an arrow is directed from each select cell gate line group MCGL to one of two ellipses. This arrow indicates memory cells out of five memory cells in a cell chain are selected or not selected. Cell select gate lines CGL0 to CGL4 contained in the cell select gate lines group MCGL are control lines common to (m×n) memory blocks MB. That is, the cell select gate line CGL0 is connected to a gate electrode of a transistor TG of the memory cell MC0 contained in cell chains CCE and CCO. In a same manner, the cell select gate line CGL1 is connected to a gate electrode of a transistor TG of the memory cell MC1 contained in cell chains CCE and CCO. The cell select gate line CGL2 is connected to a gate electrode of a transistor TG of the memory cell MC2 in cell chains CCE and CCO. The cell select gate line CGL3 is connected to a gate electrode of a transistor TG of the memory cell MC3 in cell chains CCE and CCO. The cell select gate line CGL4 is connected to a gate electrode of a transistor TG of the memory cell MC4 in cell chains CCE and CCO.

Anode lines ANL0 to ANL(m−1) are driven by the anode driver group ANDBK. The cell select gate line group MCGL is driven by the cell select MOS transistor driver group MCGDBK. Cell chain select lines CSL0 to CSLm are driven by the cell chain select driver group CSDBK.

Each of the anode lines ANL is connected with anode drivers AND different from each other. Each of the cell chain select lines CSL is also connected in a same manner. The cell select gate line group MCGL is connected with cell select MOS transistor drivers MCGD0 and MCGD1 arranged at both ends of the cell array MCA. Charging and discharging times of the cell select gate line CSL can be reduced by driving the cell select gate line from both ends of the cell array MCA.

Although described in detail later, anode lines ANL0 to ANL(m−1), the cell select gate line group MCGL and cell chain select lines CSL0 to CSLm have a wiring structure patterned to a shape having a width and an interval of a minimum processing dimension F. On a silicon substrate, anode lines ANL0 to ANL(m−1), the cell select gate line group MCGL and cell chain select lines CSL0 to CSLm are formed in this order.

Third Embodiment

Structure of Cell Array

Figure 21:
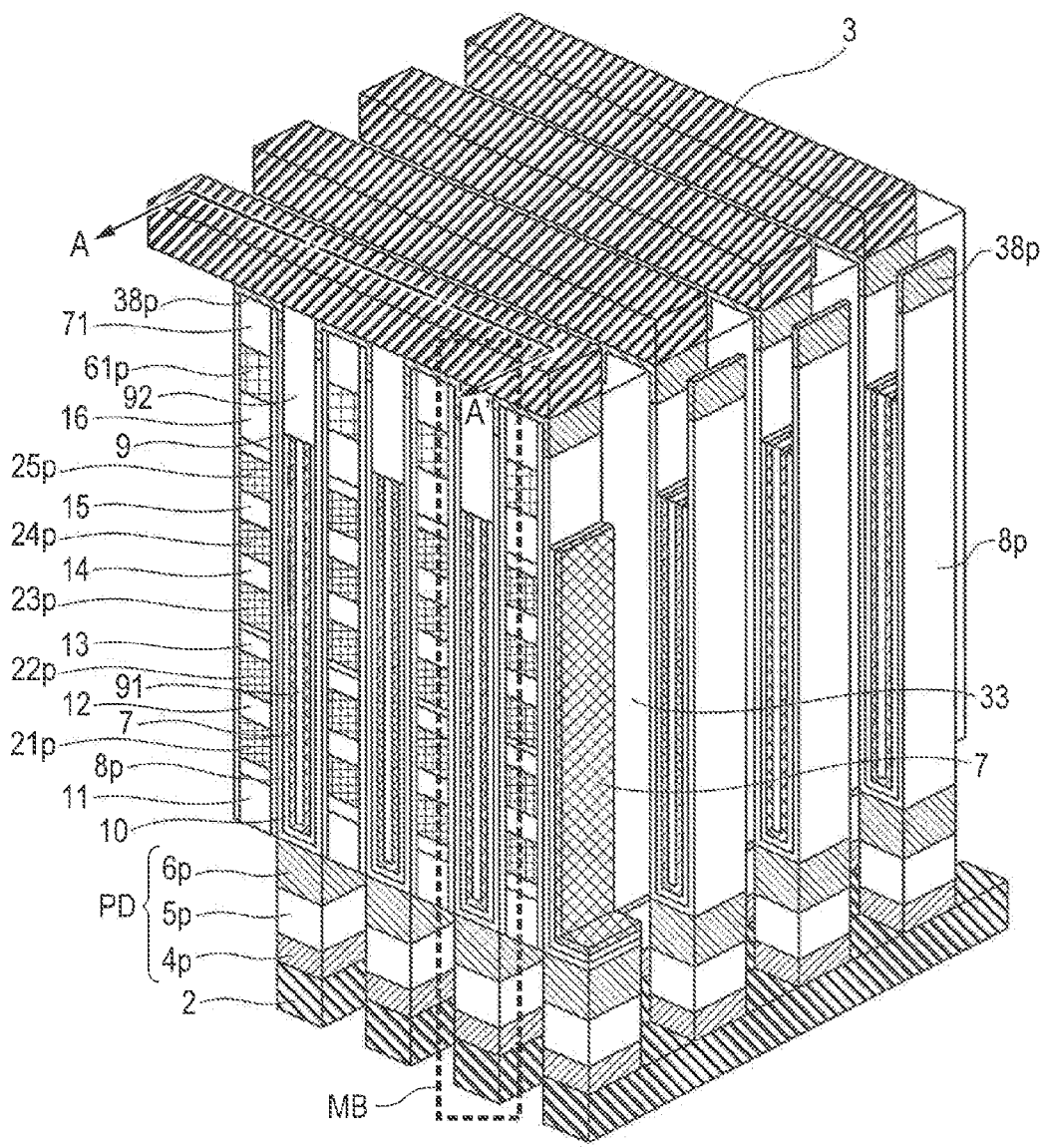
FIG. 21 is a bird's eye view showing a part of the cell array MCA from FIG. 19 mentioned above.

FIG. 21 is a bird's eye view of a part of the cell array MCA specifically extracted from FIG. 19 described above. In FIG. 21, polysilicon diode PD is formed on multiple anode lines 2 formed by patterning a metal film at a pitch of two times the minimum processing dimension F, in a periodical manner in a direction where the anode lines 2 extend. Although not shown, the metal film forming the anode lines 2 is formed on an insulating film deposited on the silicon substrate. The polysilicon diode PD has a stacked structure comprising a polysilicon layer 4$p$ doped with a p-type impurity, a polysilicon layer 5$p$ doped with a low density impurity and a polysilicon layer 6$p$ doped with an n-type impurity.

A stacked film comprising gate polysilicon layers 21$p$, 22$p$, 23$p$, 24$p$, 25$p$ and 61$p$ and a stacked film comprising insulating film layers 11, 12, 13, 14, 15, 16 and 71 are patterned in a striped shape in a direction parallel with the anode line 2. Each stripe line portions of a stacked film comprising gate polysilicon layers 21$p$, 22$p$, 23$p$, 24$p$, 25$p$ and 61$p$ and a stacked film comprising insulating film layers 11, 12, 13, 14, 15, 16 and 71 are disposed right above spaces among anode lines 2. Each of the striped spaces of a stacked film comprising gate polysilicon layers 21$p$, 22$p$, 23$p$, 24$p$, 25$p$ and 61$p$ and a stacked film comprising insulating film layers 11, 12, 13, 14, 15, 16 and 71 is formed right above each of the anode lines 2.

The bit line 3 is formed by patterning a metal film at a pitch of two times the minimum processing dimension F, has a striped shape extending in a direction vertical to the anode line 2, and is arranged above the insulating film 71 via the n-type polysilicon 38$p$.

Below the bit line 3 and in each space between a stacked layer comprising gate polysilicon layers 21$p$, 22$p$, 23$p$, 24$p$, 25$p$ and 61$p$ and a stacked layer comprising insulating film layers 11, 12, 13, 14, 15, 16 and 71, side walls of gate polysilicon layers 21$p$, 22$p$, 23$p$, 24$p$ and 25$p$ are stacked. On side walls of insulating film layers 11, 12, 13, 14 and 15 and below the side wall of the insulating film 16, a gate insulating film 9, a channel polysilicon layer 8$p$, a diffusion prevention film 10 and a phase-change material layer 7 are stacked in this order.

The diffusion prevention film 10 is a layer for preventing diffusion between the phase-change material layer 7 and the polysilicon layer 8$p$. An insulating film layer 91 is embedded between phase-change material layers 7 facing to each other. A gate insulating film layer 9 and a channel polysilicon layer 8$p$ are stacked at an upper wall part of the insulating film layer 16 and lower wall parts of gate polysilicon layer 8$p$. Between channel polysilicon layers 8$p$ facing to each other, an insulating film layer 92 is embedded. Above an insulating film layer 71, a gate insulating film layer 9 and a polysilicon layer 38$p$ are stacked.

At a bottom of the bit line 3 and in a space between a stacked film comprising gate polysilicon layers 21$p$, 22$p$, 23$p$, 24$p$, 25$p$ and 61$p$ and a stacked film comprising insulating film layers 11, 12, 13, 14, 15, 16 and 71, an upper surface of the polysilicon layer 6$p$ and the channel polysilicon layer 8$p$ are in contact with each other.

A metal wiring layer 3 serving as the bit line 3 and the polysilicon diode PD are connected to each other via the polysilicon layer 38$p$ and the channel polysilicon layer 8$p$, formed on side surfaces opposite of a pair of stacked layers formed by gate polysilicon layers 21$p$, 22$p$, 23$p$, 24$p$, 25$p$ and 61$p$ and insulating film layers 11, 12, 13, 14, 15, 16 and 71.

In spaces between a stacked film comprising gate silicon layers 21$p$, 22$p$, 23$p$, 24$p$, 25$p$ and 61$p$ and a stacked film comprising insulating film layers 11, 12, 13, 14, 15, 16 and 71 and below a space of the metal wiring 3 serving as the bit line 3, the channel polysilicon layer 8$p$, the polysilicon layer 38$p$, the phase-change material layer 7 and the diffusion prevention film 10 are eliminated. This space is provided for the polysilicon diode PD on the metal wiring layer 2 serving as the anode line 2, and an insulating film 33 is embedded therein. That is, the polysilicon layer 8$p$ and 38$p$, the phase-change material layer 7 and the diffusion prevention layer 10 are formed in a region enclosed by a stacked film comprising gate polysilicon layers 21$p$, 22$p$, 23$p$, 24$p$, 25$p$ and 61$p$, a stacked film comprising insulating film layers 11, 12, 13, 14, 15, 16 and 71, and an insulating layer 33, that is, on side surfaces of the interconnect hole.

In such a configuration as described above, a device group formed on a side wall of the interconnect hole corresponds to the cell chain CCE or CCO shown in FIG. 20. That is, gate electrodes of MOS transistors TG serving as transmission gates of memory cells MC0 to MC4 are formed by gate polysilicon layers 21$p$, 22$p$, 23$p$, 24$p$ and 25$p$, respectively. In such a manner, memory cells MC0 to MC4 are formed on the side walls of gate polysilicon layers 21$p$, 22$p$, 23$p$, 24$p$ and 25$p$.

More specifically, MOS transistors TG serving as transmission gates are formed by side walls of gate polysilicon layers 21$p$, 22$p$, 23$p$, 24$p$ and 25$p$, side walls of insulating film layers 11, 12, 13, 14 and 15, and the gate insulating film 9 and the channel polysilicon layer 8$p$ deposited below a side wall of the insulating film 16. Further, the channel polysilicon layer 8$p$ becomes a channel of MOS transistors TG serving as transmission gates in memory cells MC0 to MC4, at a height position same as gate polysilicon layers 21$p$, 22$p$, 23$p$, 24$p$ and 25$p$. Further, at a height position same as lower portion of side walls of insulating film layers 11, 12, 13, 14 and 15 and a side wall of the insulating film 16, the channel polysilicon layer 8$p$ becomes a drain electrode or a source electrode of each of the MOS transistors TG.

Position where the storage element STD is formed can be easily understood by corresponding to a position where the MOS transistor TG is formed. That is, storage elements STD of memory cells MC0 to MC4 are formed by the diffusion prevention film 10 and the phase-change material layer 7 corresponding to height positions same as gate polysilicon layers 21p, 22p, 23p, 24p and 25p. Therefore, portions serving as the storage element STD are regions at a height same as gate polysilicon layers 21p, 22p, 23p, 24p and 25p. Accordingly, a current flowing in the storage element STD passes the diffusion prevention film 10, the phase-change material layer 7 and the diffusion prevention film 10 in this order between drain and source electrodes of the MOS transistor TG.

A gate electrode of the cell chain select MOS transistor CCG is formed by the gate polysilicon layer 61p shown in FIG. 21. Thus, the cell chain MOS transistor CCG is formed on a side wall of the gate polysilicon layer 61p. More specifically, the channel polysilicon layer 8p becomes a channel of the cell chain select MOS transistor CCG at a height position same as the gate polysilicon layer 61p. Further, the channel polysilicon layer 8p becomes a source electrode or a drain electrode of the cell chain select MOS transistor CCG at a height position same as upper portions of side walls of the insulating film layer 71 and the insulating film 16.

Further, the polysilicon layer 38p serving as a source electrode is configured to have an n-type conductivity by dispersing impurities such as phosphorus in order to suppress a contact resistance with the metal film 3 serving as the bit line 3.

Figure 22:
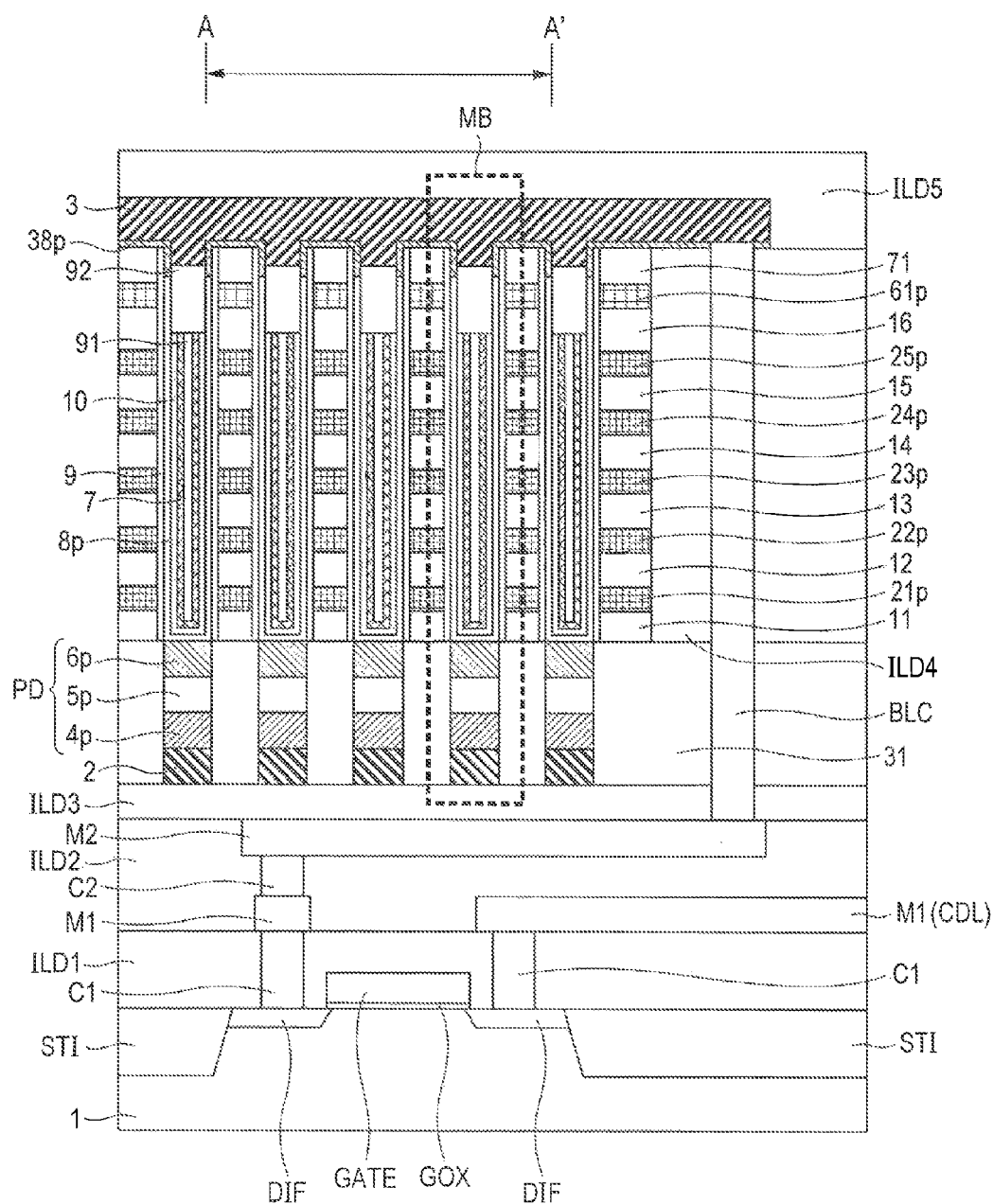
FIG. 22 is a cross sectional view showing an overall structure of the cell array MCA including the cross section AA' shown in FIG. 21.

FIG. 22 is a cross-sectional view of an overall structure of the cell array MCA including the cross section AA' shown in FIG. 21. This structure is characterized in that the cell array MCA shown in FIG. 21 is stacked on a MOS transistor formed on the semiconductor substrate 1. The transistor is used to connect a metal wiring layer 3 serving as a bit line 3 in the cell array MCA and a common data-line CDL to each other.

In FIG. 22, a shallow trench isolation STI, a transistor gate GATE, a gate insulating film GOX and a diffusion layer DIF are shown as components of the MOS transistor. Further, interlayer insulating layers ILD1, ILD2, ILD3, ILD4 and ILD5, wiring layers M1 and M2, a contact hole C1 for connecting devices on the semiconductor substrate and M1 to each other, a contact hole C2 for connecting M1 and M2 to each other, a metal wiring layer 3 serving as a bit line 3, a contact hole BLC for connecting the metal wiring layer 3 serving the bit line 3 and the MOS transistor formed on the semiconductor substrate 1 to each other, and an interlayer insulator 31 embedded between polysilicon diodes PD are shown as components of a structure for connecting the transistor and the metal wiring layer 3 serving as the bit line 3.

With such configuration, two phase-change type cell chains facing each other are formed on a side wall of an interconnect hole formed in a cross section area of $4F^2$ (=2F× 2F) assuming that a minimum processing dimension is F. Thus, a cross section area needed to form a phase-change type cell chain is $2F^2$. Accordingly, even considering that a cell chain has one set-dedicated memory cell, a bottom area needed to form one memory cell can be one $2F^2$th (k−1), which is smaller than related-art sizes. Here, the value of k is same as the number of memory cells, and k=5 in the case of FIG. 22.

Third Embodiment

Wiring Structure of Cell Array

Next, a wiring structure of the cell array MCA is described. Referring to FIG. 19 to FIG. 22, anode lines ANL0 to ANL (m−1) and bit lines BL0 to BL(n−1) are disposed by intersecting each other. Here, referring to one memory block MB00, gate electrodes of each of the MOS transistors TG in memory cells MC0 to MC4 comprising cell chains CCE and CCO are formed, in a direction where anode lines 2 extend, by gate polysilicon layers 21p, 22p, 23p, 24p and 25p individually deposited in a stripe shape.

Figure 23:
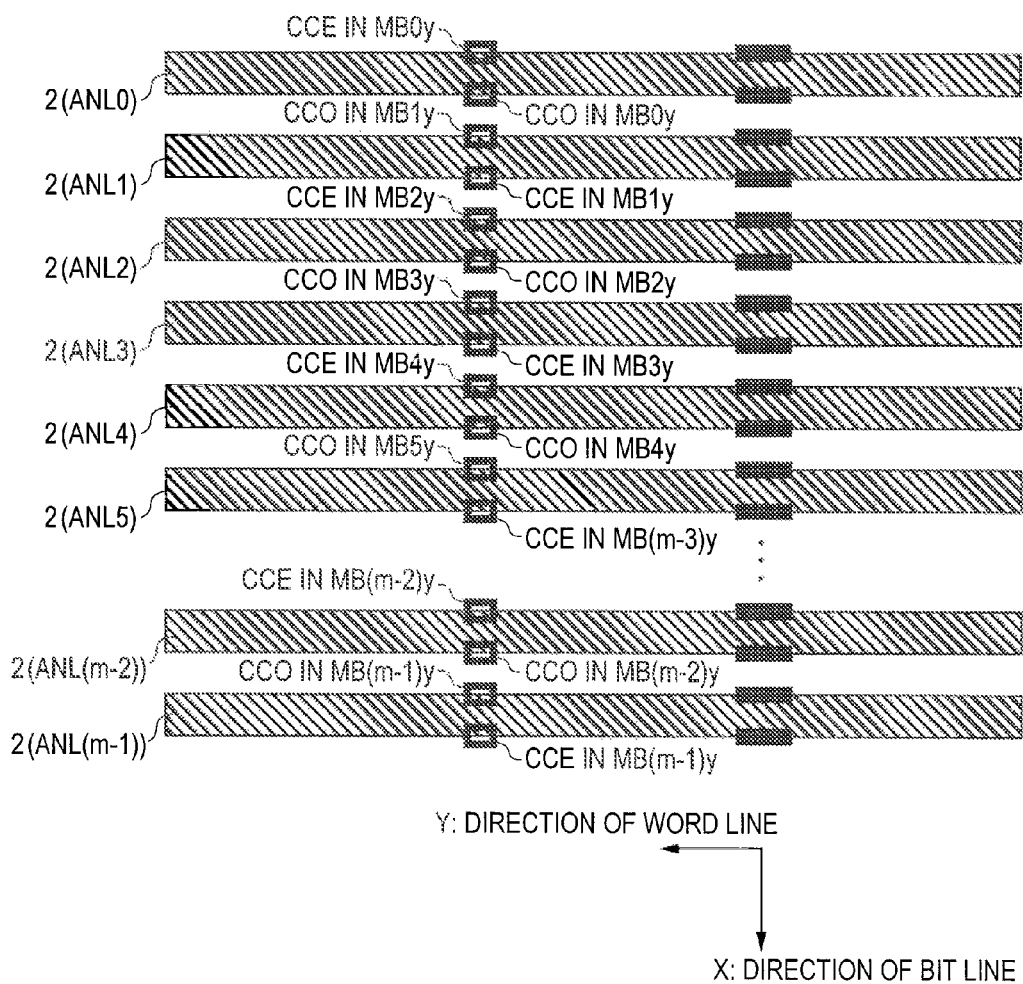
FIG. 23 is a view of a positional relationship among m pieces of anode lines ANL0 to ANL(m−1) from the side of a bit line 3.
Figure 24:
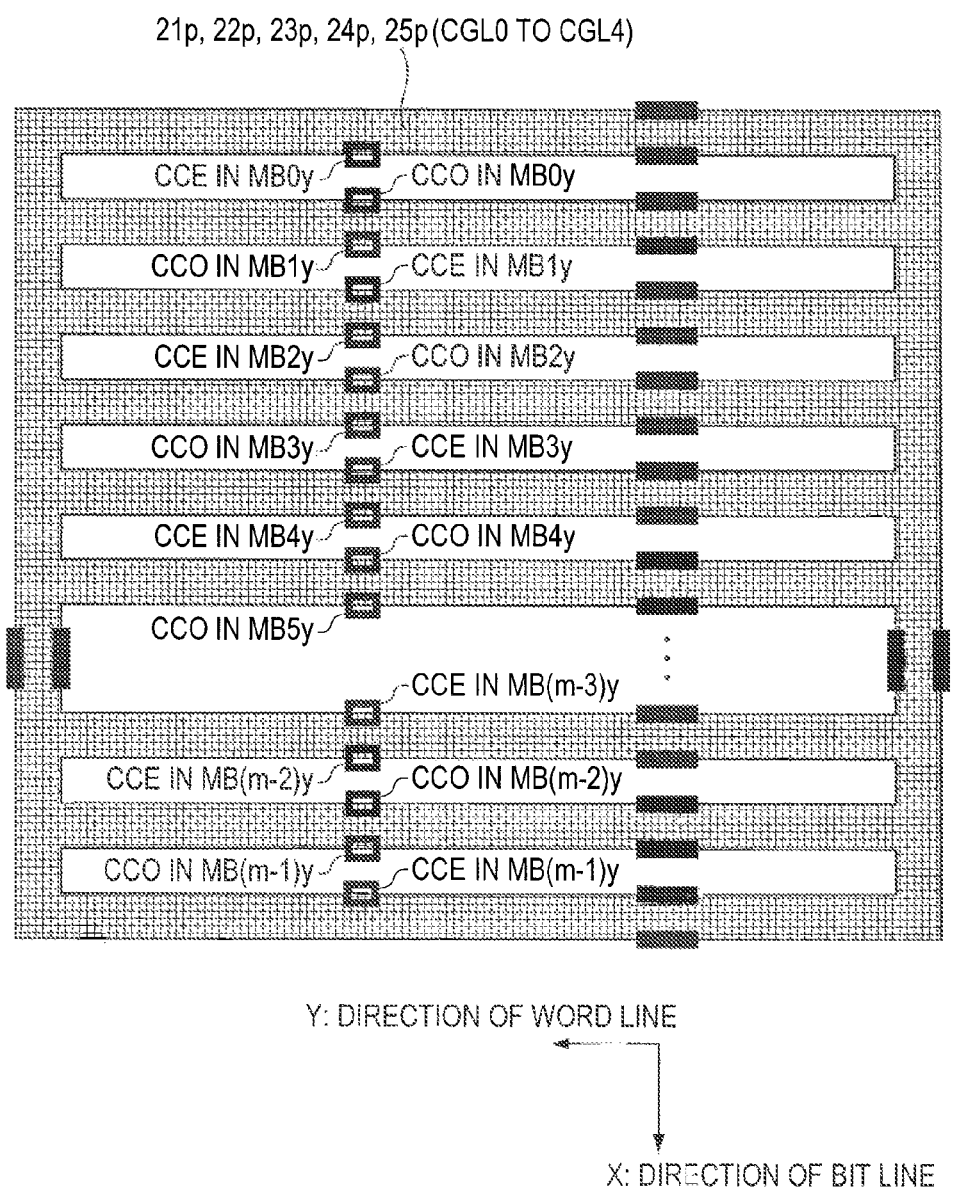
FIG. 24 is a view of a positional relationship among cell select gate lines CGL0 to CGL4 from the side of the bit line 3.

FIG. 23 is a view of a positional relationship of m anode lines ANL0 to ANL(m−1) viewed from the side of the bit line 3. FIG. 24 is a view of a positional relationship of cell select gate lines CGL0 to CGL4 similarly viewed from the bit line 3. Assuming that a direction in which m anode lines ANL0 to ANL(m−1) extend is a Y direction and a direction in which bit lines 3 extend is an X direction, (m+1) cell gate select lines CGL0 to which a gate electrode of the MOS transistor TG in the memory cell MC0 in the first layer is connected are extended in the Y direction shown in FIG. 24 and shorted at both ends. Further, cell select gate lines CGL1, CGL2, CGL3 and CGL4 to which a gate electrode of the MOS transistor TG in memory cells MC1 to MC4 in second to fifth layers also have a same wiring structure as shown in FIG. 24.

Figure 25:
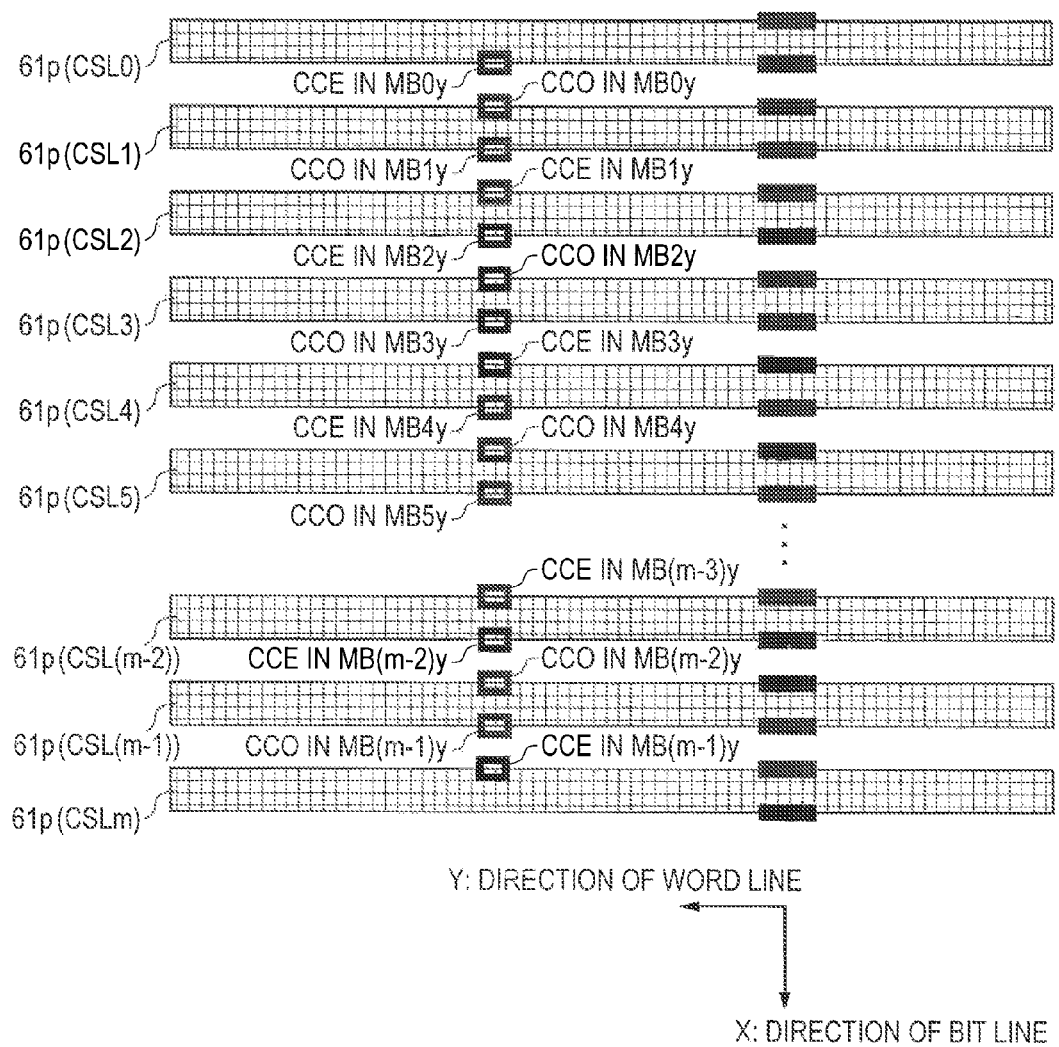
FIG. 25 is a view of a positional relationship among cell chain select lines CSL0 to CSLm from the side of the bit line 3.

FIG. 25 is a view of a positional relationship of cell chain select lines CSL0 to CSLm viewed from the side of the bit line 3. Gate electrodes of the cell chain select MOS transistor CCG are also formed, in a direction where anode lines 2 extend, by gate polysilicon layers 61p individually deposited in a stripe shape. That is, cell chain select lines CSL0 to CSLm to which gate electrodes of cell chain select MOS transistors CCG are connected are extended in the Y direction as shown in FIG. 25.

As described above, each of the polysilicon layer 8p, the phase-change material layer 7, the insulating layer 9 and the diffusion prevention layer 10 in the interconnect hole is formed in a single process. That is, multiple memory cells MC (here, four memory cells for information storage and one set-dedicated memory cell) can be formed in the interconnect hole at a time. Therefore, compared with related-art devices, a three-dimensional type semiconductor storage device can be achieved and a cost per bit can be reduced with a less number of processes and a lower cost than related-art devices.

Relationship between the number of memory blocks MB and cell chains in the cell array MCA and the number of wirings is as follows: When m (here, m is an integer larger than 1) memory blocks MB are arranged in a direction where the bit line 3 extends (that is, in X direction), a wiring pattern of metal layers 2 serving as m anode lines ANL0 to ANL(m−1) is needed. Since one memory block MB has two cell chains, cell chains CCE and CCO are formed right above respective anode lines 2.

However, since cell gate select lines CGL0 to CGL4 and cell chain select lines CSL1 to CSL(m−1) are connected to two memory blocks MB adjacent to each other in a direction along the bit 3, cell chains CCE and CCO are disposed alternately. For example, referring to a bit line 3 in a yth row, cell chains CCO of the memory blocks MB0y and MB1y are disposed adjacent to each other, and cell chains CCE of the memory blocks MB1y and MB2y are disposed adjacent to each other, as shown in FIG. 23 to FIG. 25.

The number of cell select gate lines CGL0 to CGL4 and cell chain select lines CSL0 to CSLm connected to the cell chain needs to be (m+1) respectively as shown in FIG. 24 and FIG. 25, since polysilicon layers 21p, 22p, 23p, 24p and 25p serving as cell select gate lines CGL0 to CGL4 and the polysilicon layer 61p serving as cell chain select lines CSL0 to CSLm are formed right above the space of the wiring pattern of metal layers 2 serving as anode lines ANL0 to ANL(m−1), as described by referring to FIG. 24 and FIG. 25.

Memory cells MC are formed on both side walls of polysilicon layers 21p, 22p, 23p, 24p and 25p serving cell select gate lines CGL0 to CGL4. Cell select gate lines CGL0 to CGL4 formed on a outer peripheral portion of the cell array MC are formed by using the memory cell MC formed on an inner side wall of the cell array MCA, as shown in FIG. 24. For example, referring to a bit line in a yth row as shown in FIG. 24, those memory cells MC are members forming the cell chain CCE in memory blocks MB0y to MB(m−1)y. For other cell select gate lines CGL0 to CGL4, memory cells formed on both side walls are used as members forming cell chain CCE in memory blocks MB0y to MB(m−1)y and members forming cell chains CCE and CCO in memory blocks MB1y to MB(m−2)y.

Cell chain select MOS transistors CCG are formed on both side walls of the polysilicon layer 61p serving cell chain select lines CSL0 to CSLm. Out of the cell chain select lines, cell chain select lines CSL0 and CSLm formed on an outer peripheral portion of the cell array MCA use MOS transistors formed on a side wall of the cell array MCA as shown in FIG. 25. Referring to a bit line in a yth row shown in FIG. 25, those MOS transistors are, for example, cell chain select MOS transistors CCG of the cell chain CCE in memory blocks MB0y to MB(m−1)y. Other cell chain select lines CSL1 to CSL(m−1) are used as cell chain select MOS transistors CCG of the cell chain CCO in memory blocks MB0y to MB(m−1)y or cell chains CCE and CCO in memory blocks MB1y to MB(m−2)y.

As described above, the cell array MCA according to the third embodiment comprises control lines of three systems extending in the Y direction. To discern from the view point of the function, those control lines are defined as anode lines ANL0 to ANL(m−1), a cell select gate line group MCGL, and cell chain select lines CSL0 to CSLm. Those control lines are orthogonal to the bit line 3. Thus, any one system of anode lines ANL0 to ANL(m−1), the cell select gate line group MCGL and cell chain select lines CSL0 to CSLm may be especially called as a word line similarly with a memory of the related art.

Third Embodiment

Operation of Memory Array Circuit

Hereinafter, write operation and read operation in the memory block MB10 is described. In this operation, a pair of cell chains in the memory block MB10 is electrically connected in the set operation to apply the set pulse current SETPLS to the memory cell MC0 disposed at both cell chains, and information is written concurrently into a pair of cell chains. FIG. 26 is a table showing a relation of drive voltages in anode lines ANL and bit lines BL. A bit line BL0 to be selected, and anode lines ANL0 and ANL2 to ANL(m−1) to be held in an unselected condition are held at 0 V in any operation. The anode line ANL1 to be selected and bit lines BL1 to BL(m−1) to be held in an unselected condition are driven with 5 V in the reset operation, 4 V in the set operation, and 2 V in the read operation.

In such a state of voltage application, referring to a potential difference of the anode line 2 and the bit line 3 with respect to the diode PD in a memory block MB, only the memory block MB10 is in a forward biased state as the anode line ANL1 is driven to a positive voltage and the bit line BL0 is held at the ground voltage. That is, the memory block MB10 is selected.

The potential difference in memory blocks MB00 and MB20 to MB (m−1) where both anode lines ANL0 and ANL2 to ANL(m−1) and bit line BL0 are held at the ground voltage of 0 V is zero. Those anode lines and the bit line are therefore held in an unselected condition. Also in memory blocks MB11 to MB (n−1) in which the anode line ANL1 and bit lines BL1 to VL(n−1) are driven to a positive voltage, the potential voltage is zero. The anode line ANL1 and bit lines are therefore held in an unselected condition.

Memory blocks MB01-MB01 and MB21 to MB(m−1)(n−1) in which anode lines ANL0 and ANL0 to ANL(m−1) are held at the ground voltage, and bit lines BL1 to BL(n−1) are driven to a positive voltage turn to a reverse biased state, whereby the withstand voltage of the polysilicon diode PD can be higher than 5 V. Therefore, even if any one of cell chains is electrically connected, current flowing in the diode is suppressed, and thereby those memory blocks MB01 to MB0 and MB21 to MB (m−1) (n−1) are also held in an unselected condition.

FIG. 27 is a table showing drive voltages of cell chain select lines CSL. In the set operation, cell chain select lines CSL1 and CSL5 are driven to 5 V, and other cell chain select lines CSL0 and CSL2 to CSLm are driven to 0 V, whereby cell chains CCE and CCO in the memory block MB10 can be selected. On the other hand, in the reset operation and the read operation, either one of cell chain select lines CSL1 and CSL2 is driven to 5 V and other cell chain select lines are driven to 0 V, whereby either one of cell chains CCE and CCO in the memory block MB10 can be selected.

FIG. 28 is a table showing drive voltages of cell select gate lines CGL0 to CGL4. In the set operation, the cell select gate line CGL0 is driven to 0 V and other cell select gate lines CGL1 to CGL4 are driven to 5 V, whereby only the lowest memory cell MC0 in cell chains CCE and CCO of the memory block MB10 can be selected.

Figure 29:
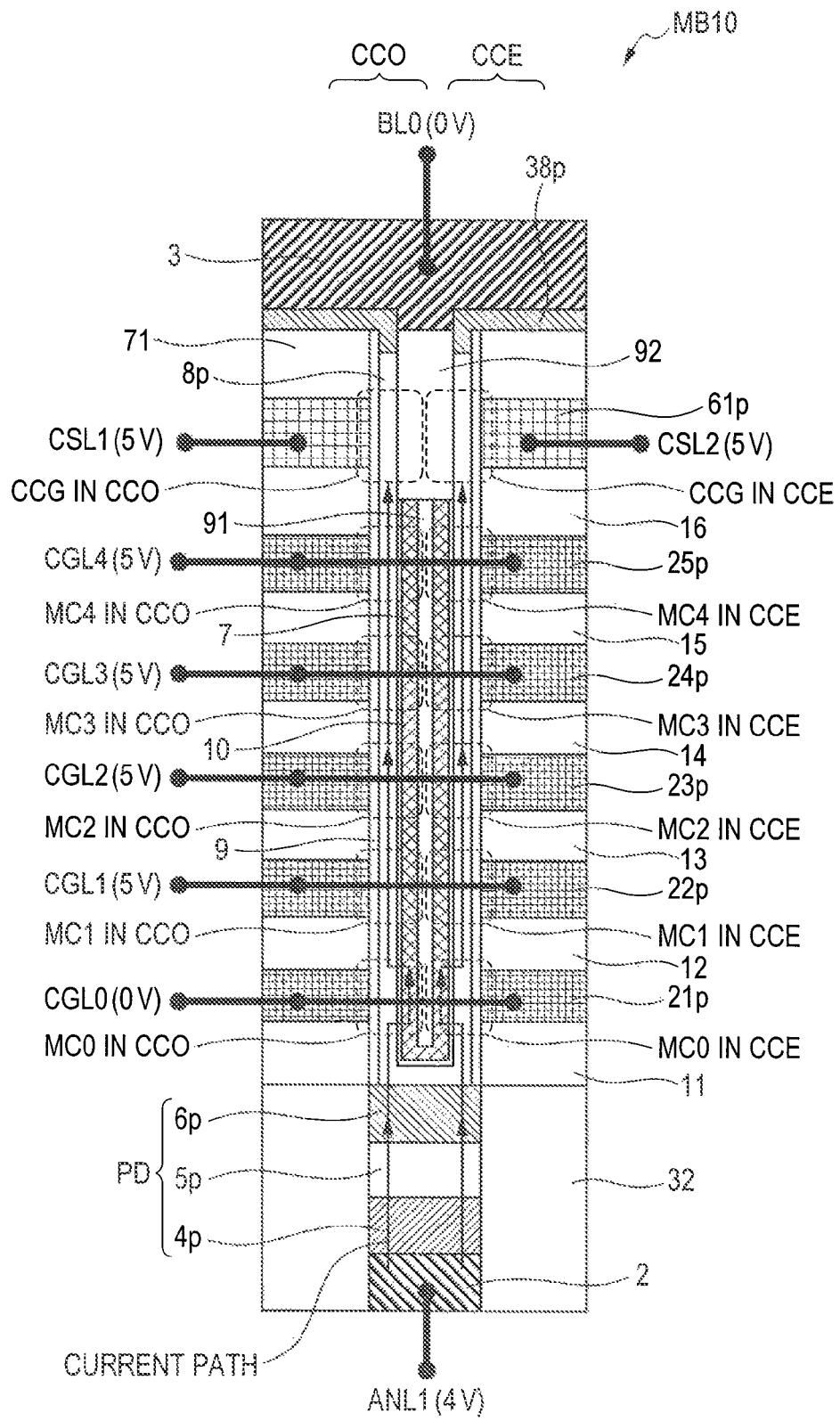
FIG. 29 is a cross sectional view of the memory block MB10 corresponding to the circuit configuration shown in FIG. 20.
Figure 30:
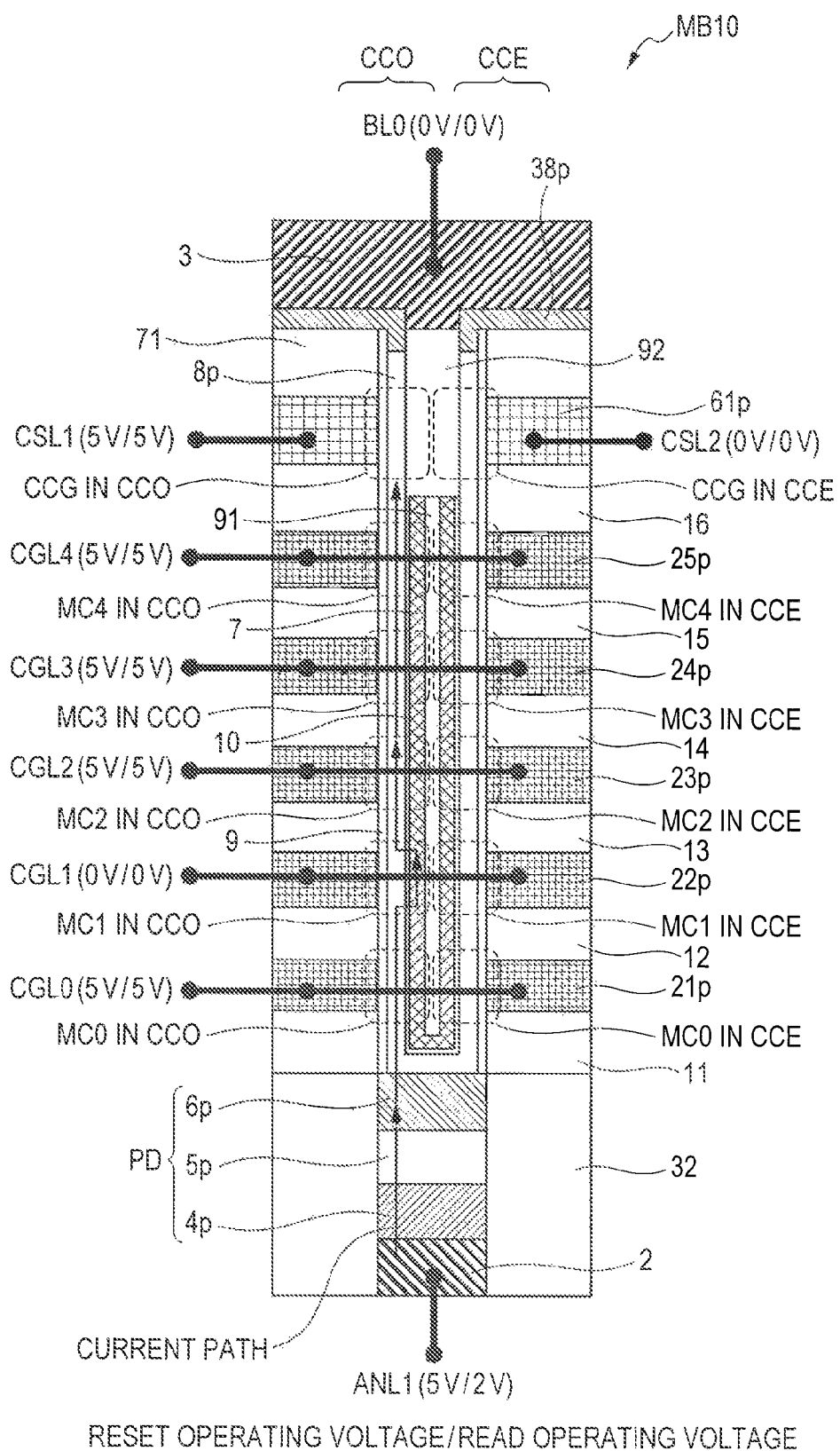
FIG. 30 is a cross sectional view of the memory block MB10 corresponding to the circuit configuration shown in FIG. 20.

FIG. 29 and FIG. 30 are cross-sectional views of the memory block MB10 corresponding to the circuit configuration shown in FIG. 20. Hereinafter, state of elements in the memory block MB10 selected in the set operation is described in detail. In FIG. 29, operating voltages of respective terminals are shown. Although not shown in FIG. 21 and FIG. 22 for simplification of the description, the insulating layer 32 is an insulating film embedded between polysilicon diodes adjacent to each other.

First, 0 V is applied to the bit line BL0, and 4 V is applied to the anode line ANL1. In cell chains CCE and CCO, 0 V is applied to the cell select gate line CGL0 to which a set-dedicated memory cell MC0 is connected, to turn off a transistor using the polysilicon layer 8p as a channel. 5 V is applied to cell select gate lines CGL1 to CGL4 to which other memory cells MC1 to MC4 are connected to have transistors electrically connected. 5 V is applied to polysilicon layers 61p which turn to cell chain select lines CSL1 and CSL2 to have the cell chain select gate CCG electrically connected.

By such control, in cell chains CCE and CCO, MOS transistors TG serving as transmission gates in memory cells MC1 to MC4 in an unselected condition are electrically connected and thereby channel resistance decreases. Further, since the cell chain select MOS transistor CCG is also electrically connected, resistance of polysilicon layers 8p in the MOS transistors also decreases. Accordingly, in memory cells MC1 to MC4, substantially the same current can flow via MOS transistors TG irrespective of the state of the phase-change material layer 7.

In the memory cell MC0 in the selected condition, the MOS transistor TG is turned off and thereby current flows into the phase-change material layer 7. That is, utilizing Joule heat generated by the set current flowing in the phase-change material layer 7, resistance of phase-change material layers 7 in all cell chains is decreased, and information stored in all memory cells in the memory block MB10 is erased concurrently, that is, re-written to the information [1].

Next, state of elements when the memory cell MC1 in the cell chain CCO of the memory block 10 is selected in the reset operation is described in detail with reference to FIG. 30. In FIG. 30, operating voltages of respective terminals are shown.

First, 0 V is applied to the bit line BL0, and 5 V is applied to the anode line ANL1. In cell chains CCE and CCO, 0 V is applied to the cell select gate line CGL1 to which the memory cell MC1 is connected, to turn off a transistor using the polysilicon layer 8p as a channel. 5 V is applied to cell select gate lines CGL0 and CGL2 to CGL4 to which other memory cells MC0 and MC2 to MC4 are connected, to have transistors electrically connected.

5 V is applied to the polysilicon layer 61p which turns to the cell chain select line CSL1, and 0 V is applied to the polysilicon layer 61p which turns to the cell chain select line CSL2, whereby cell chain select gates CCG in the cell chain CCO are electrically connected. At that time, cell chain select gates CCG in the cell chain CCE are turned off.

By such a control, in the cell chain CCO, MOS transistors TG turning transmission gates in memory cells MC0 and MC2 to MC4 in the unselected condition are electrically connected, and thereby channel resistance decreases. Further, since cell chain select MOS transistors are also electrically connected, resistance of polysilicon layers 8p in the MOS transistors also decrease. Accordingly, in memory cells MC0, and MC2 to MC4, substantially the same current can be flown via MOS transistors irrespective of the state of the phase-change material layer 7.

In the memory cell MC1 in the selected condition, the MOS transistor TG is turned off and thereby current flows into the phase-change material layer 7. That is, utilizing Joule heat generated by the reset current flowing in the phase-change material layer 7, resistance of phase-change material layers 7 in the memory cell MC1 is increased, and the information [0] is recorded. Since the reset operation time is shorter than the set operation time, diffusion range of Joule heat generated in the memory cell MC1 is limited to the memory cell MC1. By performing the same reset operation with respect to memory cells MC2 to MC4, the information [0] can be recorded in desired memory cells.

In the read operation, 2 V, a voltage lower than in the set operation and the reset operation, is applied to the anode line ANL1, and select operations same as the reset operation are performed to detect a current value flowing in the phase-change material layer 7 in a desired memory cell, whereby stored information is discriminated.

Third Embodiment

Summary

As described above, the semiconductor storage device according to the third embodiment has narrowed intervals among memory cells in the interconnect hole due to a half reduction of the effective memory area compared with a memory cell according to the first embodiment. However, after a pair of cell chains is erased (here, the set operation) concurrently by using memory cells for information storage, sequential reset operations are performed with respect to memory cells for information storage, whereby information can be recorded by selectively applying the current to memory cells in the memory block MB10.

The polysilicon diode PD according to the third embodiment may be provided instead of the block select transistor BTR according to the first and second embodiments. By using the polysilicon diode PD, the effective area can be reduced than the block select transistor BTR.

As above, the invention made by the present inventors is described specifically according to the embodiments. The present invention is not limited to the embodiments and may be modified in various manners without deviating from the spirit thereof.

What is claimed is:

1. A semiconductor storage device comprising:
   a substrate;
   a first select line disposed above the substrate;
   a select element disposed above the first select line and in which a drain-source current flows vertically with respect to the substrate;
   a first stacked structure, the first stacked structure having a structure in which a plurality of semiconductor layers are stacked and disposed above the select element;
   a second select line arranged in a direction intersecting with the first select line and disposed above the first stacked structure;
   a gate insulating layer disposed along a side of the first stacked structure;
   a channel layer disposed along a side of the gate insulating layer,
   a variable resistive element material layer disposed along a side of the channel layer and including a variable resistive element material whose resistance value varies according to a current; and
   a current-bias circuit configured to apply current to the semiconductor layers,
   wherein the channel layer, the variable resistive element material layer, and the select element are provided in a region where the first select line and the second select line intersect with each other, and
   wherein the current-bias circuit applies a first current to a first portion of the variable resistive element material layer located on a side surface of a first semiconductor layer out of the semiconductor layers, and thereafter applies a second current to a second portion of the variable resistive element material layer located on a side surface of any one of the semiconductor layers other than the first semiconductor layer, the application time of the second current being shorter than an application time of the first current.

2. The semiconductor storage device according to claim 1, wherein a current value of the first current is smaller than a current value of the second current.

3. The semiconductor storage device according to claim 1,
   wherein an inter-gate insulating layer is formed between adjacent semiconductor layers, and
   wherein each of the semiconductor layers is configured as a gate electrode of a transistor comprising corresponding portions of the gate insulating layer and the channel layer.

4. The semiconductor storage device according to claim 3,
   wherein the transistor is configured in such a manner that
   when the transistor is in a conductive state by applying a first potential to the gate electrode, a resistance value of the transistor becomes lower than a resistance value of the variable resistive element material layer, and
   when the transistor is turned off by applying a second potential to the gate electrode, the resistance value of the variable resistive element material layer becomes lower than the resistance value of the transistor.

5. The semiconductor storage device according to claim 4, wherein the current-bias circuit is configured in such a manner as to apply the first current to the first portion of the variable resistive element material layer located on a side surface of the first semiconductor layer, and apply the second current, after the corresponding transistor is in a conductive state, to a storage element configured on the first semiconductor layer by applying the first potential to a gate electrode thereof, and then turning off the transistor in a storage element configured on one of the semiconductor layers other than the first semiconductor layer by applying the second potential to a gate electrode thereof.

6. The semiconductor storage device according to claim 1, further comprising:
a control device configured to count a number of times the first current is applied,
wherein, when the number of times the first current is applied to the first portion of the variable resistive element material layer located on a side surface of the first semiconductor layer reaches a predetermined number, the current-bias circuit changes the variable resistive element material layer to which the first current is applied to a portion of the variable resistive element material layer in a memory cell configured on a semiconductor layer other than the first semiconductor layer.

7. The semiconductor storage device according to claim 6, wherein the current-bias circuit selects a storage element to which the first current is applied, by applying a potential to the first semiconductor layer, the potential being of a level so as to make an electric resistance of the channel layer of the corresponding transistor higher than an electric resistance of the channel layer of a transistor in a memory cell configured on a semiconductor layer other than the first semiconductor layer, and changes a semiconductor layer to which the first current is to be applied to one of the semiconductor layers other than the first semiconductor layer, by changing the potential applied to the first semiconductor layer.

8. The semiconductor storage device according to claim 1,
wherein the semiconductor storage device includes a second stacked structure comprising a structure in which a plurality of semiconductor layers are stacked and disposed above the select element,
wherein each of the first stacked structure and the second stacked structure comprises a cell chain select switch for selection thereof, and
wherein the gate insulating layer, the channel layer, and the variable resistive element material layer are formed along side surfaces of the first stacked structure and the second stacked structure and are separated to a side of the first stacked structure and a side of the second stacked structure by an insulating layer.

9. The semiconductor storage device according to claim 1, wherein a transistor is provided as the select element.

10. The semiconductor storage device according to claim 1, wherein a diode in which a p-type impurity semiconductor and an n-type impurity semiconductor are stacked is provided as the select element.

11. The semiconductor storage device according to claim 1,
wherein the variable resistive element material is a chalcogenide material,
wherein the first current is a current which turns the chalcogenide material to a crystallized state, and
wherein the second current is a current which turns the chalcogenide material to an amorphous state.

* * * * *